(12) United States Patent
Nagatani et al.

(10) Patent No.: US 7,496,152 B2
(45) Date of Patent: Feb. 24, 2009

(54) ADAPTIVE CONTROL APPARATUS

(75) Inventors: Kazuo Nagatani, Kawasaki (JP);
Tokuro Kubo, Kawasaki (JP);
Hiroyoshi Ishikawa, Kawasaki (JP);
Yasuyuki Oishi, Kawasaki (JP); Toru Maniwa, Kawasaki (JP); Hiroyuki Hayashi, Kawasaki (JP); Hajime Hamada, Kawasaki (JP); Nobukazu Fudaba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 406 days.

(21) Appl. No.: 10/976,290

(22) Filed: Oct. 26, 2004

(65) Prior Publication Data
US 2005/0058220 A1 Mar. 17, 2005

Related U.S. Application Data

(63) Continuation of application No. PCT/JP02/05324, filed on May 31, 2002.

(51) Int. Cl.
*H04K 1/02* (2006.01)
*H04L 25/03* (2006.01)
*H04L 25/49* (2006.01)

(52) U.S. Cl. ........................ 375/296; 375/219

(58) Field of Classification Search ................. 375/229, 375/230, 231, 232, 233, 354, 358, 362, 371, 375/373, 375, 296, 219; 708/100, 200, 300, 708/301, 309, 311, 322; 327/100, 141, 144, 327/145, 146, 149, 153, 155, 161, 162
See application file for complete search history.

(56) References Cited

U.S. PATENT DOCUMENTS

| | | | | |
|---|---|---|---|---|
| 4,217,586 A | * | 8/1980 | McGuffin | 342/380 |
| 5,280,539 A | * | 1/1994 | Yeom et al. | 375/354 |
| 5,763,803 A | * | 6/1998 | Hoshiai et al. | 84/626 |
| 6,133,789 A | | 10/2000 | Braithwaite | |
| 6,223,318 B1 | * | 4/2001 | Yamashita et al. | 714/744 |
| 6,275,106 B1 | * | 8/2001 | Gomez | 330/151 |

(Continued)

FOREIGN PATENT DOCUMENTS

JP 2001-189685 7/2001

(Continued)

OTHER PUBLICATIONS

European Search Report dated Sep. 6, 2006.

(Continued)

*Primary Examiner*—Curtis B Odom
(74) *Attorney, Agent, or Firm*—Katten Muchin Rosenman LLP

(57) ABSTRACT

Disclosed is an adaptive control apparatus having an error calculation unit for calculating the difference between a reference signal and a feedback signal, and an adaptive controller for applying adaptive control so as to diminish the difference and causing the result of adaptive control to be reflected in the reference signal. The adaptive control apparatus has a delay unit for delaying at least one of the reference signal and feedback signal by a set delay time in such a manner that the reference signal and feedback signal will be input simultaneously to the arithmetic unit; a frequency-component detecting unit for detecting a frequency component of the reference signal; a delay-time acquisition unit for acquiring delay time conforming to the frequency component; and a delay-time setting unit for setting the acquired delay time in the delay unit.

11 Claims, 18 Drawing Sheets

U.S. PATENT DOCUMENTS 6,982,992 B1 * 1/2006 Iwami .................. 370/480
2004/0026608 A1 * 2/2004 Drescher et al. ....... 250/231.13

FOREIGN PATENT DOCUMENTS

| JP | 2001-345718 | 12/2001 |
|----|-------------|---------|
| JP | 2002-077258 | 3/2002  |
| WO | 02/17586    | 2/2002  |

OTHER PUBLICATIONS

International Searching Report dated Jul. 12, 2002.
European Search Report dated Feb. 20, 2008, from corresponding European Application No. 07114819.1-1246.
European Search Report dated Feb. 20, 2008, from corresponding European Application No. 07114818.3-1246.
European Search Report dated Feb. 20, 2008, from corresponding European Application No. 07114817.5-1246.

* cited by examiner

FIG. 18
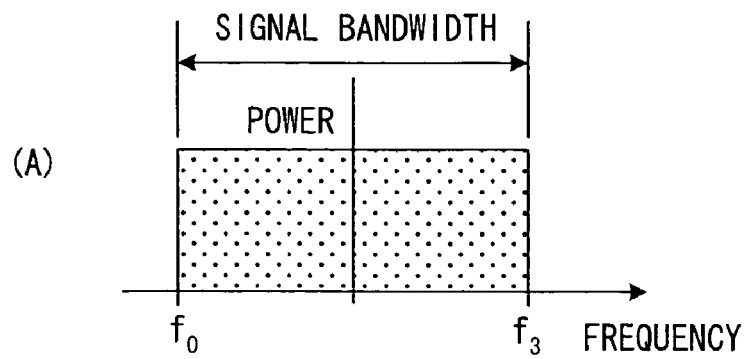
(A)
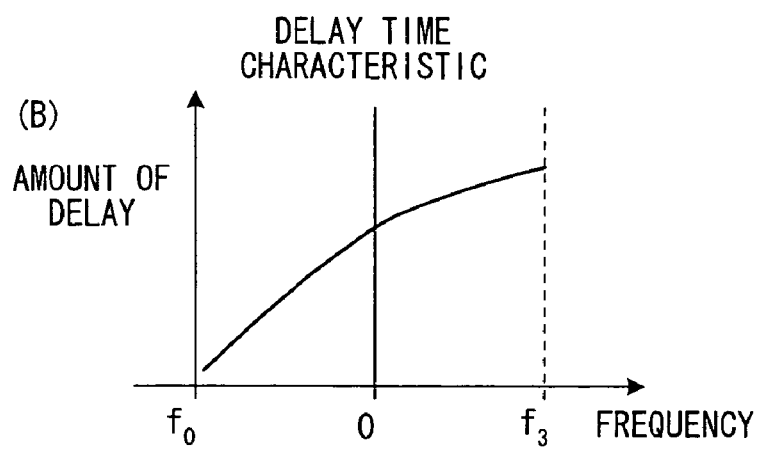
(B)
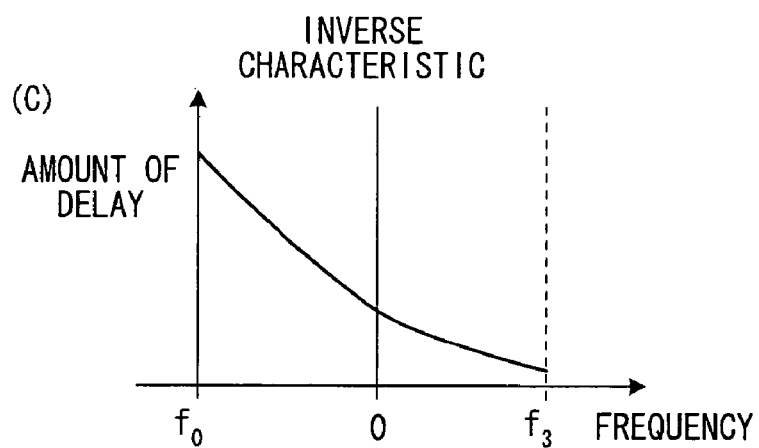
(C)

ADAPTIVE CONTROL APPARATUS

CROSS-REFERENCE TO RELATED APPLICATION

The present application is a continuation of International Application No. PCT/JP02/05324 which was filed on May 31, 2002, which is herein incorporated by reference.

BACKGROUND OF THE INVENTION

This invention relates to an adaptive control apparatus and, more particularly, to an adaptive control apparatus having a function for adjusting delay time so as to the null the delay time between a reference signal and a feedback signal.

In an apparatus for performing adaptive control using a feedback signal, the apparatus generally calculates the difference between a reference signal and a feedback signal, performs adaptive control so as to diminish the difference and produces an output upon reflecting the result of adaptive control in the reference signal.

FIG. 19 is a block diagram of an adaptive control apparatus 1 for compensating for distortion that occurs in a power amplifier. The apparatus includes an error calculation unit 1a for calculating the difference between a transmit signal x(t), which is a reference signal, and a feedback signal y(t); delay units 1b, 1c for delaying these signals so as to null the delay time between the reference signal and the feedback signal; and an adaptive controller 1d for performing adaptive control so as to diminish the error e(t) and for causing the result of adaptive control to be reflected in the reference signal. The signal obtained by reflecting the result of adaptive control in the reference signal is input to a modulator 2 by the adaptive controller 1d, the modulator 2 applies modulation processing to the input signal, a DA converter 3 converts the modulated signal to an analog signal and inputs the analog signal to a power amplifier 4, and the power amplifier 4 amplifies the input signal and then releases it into space from an antenna 5. A directional coupler 6 extracts part of the output of the power amplifier and inputs it to a demodulator 8 via an AD converter 7. The demodulator 8 applies demodulation processing to the input signal and inputs the demodulated signal to the adaptive control apparatus 1. The error calculation unit 1a calculates the difference e(t) between a reference signal x'(t) and a feedback signal y'(t) that enter via the delay units 1b, 1c, and the adaptive controller Id performs adaptive control so as to diminish the error e(t) and causes the result of adaptive control to be reflected in the next reference signal. By virtue of the control above, the feedback signal can be made to agree with a distortion-free reference signal. That is, the distortion produced by the power amplifier 4 can be compensated for and a distortion-free signal can be transmitted.

FIG. 20 is a diagram useful in describing the operation of the adaptive controller. The adaptive controller has a reflecting unit 11 for reflecting the result of adaptive control in the reference signal x(t) and outputting the resultant signal, and an adaptive control calculation unit 12. In the reflecting unit 11, a multiplier (predistortion unit) 11a multiplies the transmit signal x(t) by a distortion compensation coefficient $h_n(p)$ and outputs the result of multiplication. A distortion compensation coefficient memory 11b, which stores the distortion compensation coefficient $h_n(p)$ that conforms to power p [$=|x(t)|^2$] of the transmit signal x(t), updates the distortion compensation coefficient $h_n(p)$ by a distortion compensation coefficient $h_{n+1}(p)$ found by an LMS adaptive algorithm in the adaptive control calculation unit 12. An address generator 11c calculates the power p [$=|x(t)|^2$] of the transmit signal x(t) and outputs the result as a readout address $A_R$. A delay unit 11d generates a write address $A_W$ of the distortion compensation coefficient memory 11b. The distortion compensation coefficient $h_n(p)$ is read out from the address $A_R$ indicated by the power p of the transmit signal x(t) and a prescribed period of time is required until the next distortion compensation coefficient $h_{n+1}(p)$ is found. Accordingly, the delay unit 11d is adapted so as to delay the generation of the write address for this period of time so that the old distortion compensation coefficient $h_n(p)$ can be updated by the new distortion compensation coefficient $h_{n+1}(p)$.

In the adaptive control calculation unit 12, a multiplier 12a performs multiplication between the difference signal e(t), which represents the difference between the reference signal x'(t) and the feedback signal y'(t), and a step-size parameter μ (<1), and a complex-conjugate signal output unit 12b outputs a complex conjugate signal y*(t). A multiplier 12c performs multiplication between the distortion compensation coefficient $h_n(p)$ and y*(t), and a multiplier 12d performs multiplication between μe(t) and u*(t). A delay unit 12e adjusts the timing at which the distortion compensation coefficient $h_n(p)$ is output, and an adder 12f adds the distortion compensation coefficient $h_n(p)$ and μe(t)u* and outputs the new distortion compensation coefficient $h_{n+1}(p)$.

The arithmetic operations performed by the arrangement set forth above are as set forth below. Here it is assumed that the power amplifier 4 has a distortion function f(p).

$$h_{n+1}(p)=h_n(p)+\mu e(t)u^*(t)$$

$$e(t)=x(t)-y(t)$$

$$y(t)=h_n(p)x(t)f(p)$$

$$u(t)=x(t)f(p)=h^*_n(p)y(t)$$

$$P=|x(t)|^2$$

$$h^*_n(p)h_n(p)=1$$

where x, y, f, h, u, e represent complex numbers and * signifies a complex conjugate. By executing the processing set forth above, the distortion compensation coefficient $h_n(p)$ is updated and eventually converges to the optimum distortion compensation coefficient so that compensation is made for the distortion in the power amplifier 4.

Thus, it is necessary to equalize the delay time it takes for the reference signal x(t) to reach the error calculation unit 1a upon being input to the adaptive control apparatus 1 and the delay time it takes for the feedback signal y(t) to reach the error calculation unit 1a. In the prior art, therefore, a delay-time controller 9 is provided, as shown in FIG. 21, and controls the delay time of the delay unit 1c so that the timings at which the reference signal and feedback signal enter the error calculation unit 1a will agree. That is, while varying the delay time of the feedback signal, the delay-time controller 9 uses a correlator 9a to calculate the correlation between the reference signal output from the delay unit 1b and the feedback signal output from the delay unit 1c, and uses a delay-time setting unit 9b to obtain the delay time for which the correlation is maximized and to set this delay time in the delay unit 1c. As a result, it is possible to equalize the delay time it takes for the reference signal x(t) to reach the error calculation unit 1a upon being input to the adaptive control apparatus 1 and the delay time it takes for the feedback signal y(t) to reach the error calculation unit 1a.

The delay time of the feedback signal varies depending upon the frequency band and bandwidth, etc., of the reference signal. No problems arise, therefore, if the frequency component of the reference signal x(t) is constant. If the frequency component varies, however, then the delay time until the reference signal x(t) arrives at the error calculation unit 1a and the delay time until the feedback signal y(t) arrives at the error calculation unit 1a will no longer be equal and adaptive control can no longer be performed favorably. For example, if the power amplifier is subjected to distortion compensation by adaptive control, the distortion compensation coefficient will not converge in optimum fashion and the noise floor will rise. It should be noted that even if the delay-time controller 9 controls delay time in real time, delay-time control will not be able to follow up the change in frequency and be executed at high speed, as a result of which the problems mentioned above will arise.

In a transmission apparatus that transmits a plurality of transmit signals using a multicarrier signal, the number of carriers and carrier placement vary depending upon whether or not each of the transmit signals is present, and the delay time of the feedback signal changes owing to this variation. The problems described above arise as a result.

Further, in multicarrier transmission, the delay time of the feedback signal varies also depending upon the power of each carrier signal and the temperature inside the apparatus. The problems described above arise as a result.

SUMMARY OF THE INVENTION

Accordingly, an object of the present invention is to make it possible to equalize the delay time until the reference signal x(t) arrives at an error calculation unit and the delay time until the feedback signal y(t) arrives at the error calculation unit even in a case where the frequency component of the reference signal varies, thereby enabling adaptive control to be performed in excellent fashion.

Another object of the present invention is to make it possible to equalize the delay time until the reference signal x(t) arrives at an error calculation unit and the delay time until the feedback signal y(t) arrives at the error calculation unit even in a case where the number of carriers and carrier placement vary, thereby enabling adaptive control to be performed in excellent fashion.

A further object of the present invention is to make it possible to equalize the delay time until the reference signal x(t) arrives at an error calculation unit and the delay time until the feedback signal y(t) arrives at the error calculation unit even if there is a change in the power of each carrier signal or in temperature inside the apparatus in multicarrier transmission, thereby enabling adaptive control to be performed in excellent fashion.

A further object of the present invention is to make it possible to equalize the delay time until the reference signal x(t) arrives at an error calculation unit and the delay time until the feedback signal y(t) arrives at the error calculation unit even in a case where carrier frequency varies, thereby enabling adaptive control to be performed in excellent fashion.

The present invention relates to an adaptive control apparatus for calculating the difference between a reference signal and a feedback signal, applying adaptive control so as to diminish the difference, reflect the results of adaptive control in the reference signal and output the resultant signal.

A first adaptive control apparatus according to the present invention comprises ① a delay unit for delaying at least one of a reference signal and feedback signal by a set delay time in such a manner that the reference signal and feedback signal will be input simultaneously to an arithmetic unit (error calculation unit) that calculates the error; ② a frequency-component detecting unit for detecting a frequency component of the reference signal; ③ a delay-time acquisition unit for acquiring the delay time based upon the frequency component; and ④ a delay-time setting unit for setting the acquired delay time in the delay unit. In accordance with this adaptive control apparatus, the reference signal and feedback signal can be made to arrive at the error calculation unit simultaneously even in a case where the frequency component of the reference signal varies. This makes it possible to perform adaptive control in excellent fashion.

A second adaptive control apparatus according to the present invention comprises ① a delay unit for delaying at least one of a reference signal and feedback signal by a set delay time in such a manner that the reference signal and feedback signal will be input simultaneously to an error calculation unit; ② a delay-time acquisition unit for acquiring the delay time based upon number of carriers and carrier placement if the reference signal is a multicarrier signal; and ③ a delay-time setting unit for setting the acquired delay time in the delay unit. In accordance with this adaptive control apparatus, the delay time until the reference signal arrives at an error calculation unit and the delay time until the feedback signal arrives at the error calculation unit can be equalized even if the number of carriers and carrier placement vary. As a result, adaptive control can be performed in excellent fashion.

Further, if it is so arranged that the delay time is acquired and set in the delay unit based upon the number of carriers and carrier placement of a multicarrier signal serving as the reference signal and the power of each carrier signal, then the delay time until the reference signal arrives at the error calculation unit and the delay time until the feedback signal arrives at the error calculation unit can be equalized even in a case where the number of carriers, carrier placement and power vary. As a result, adaptive control can be performed in excellent fashion.

Further, if it is so arranged that the delay time is acquired and set in the delay unit based upon the number of carriers and carrier placement of a multicarrier signal serving as the reference signal and the temperature inside the apparatus, then the delay time until the reference signal arrives at the error calculation unit and the delay time until the feedback signal arrives at the error calculation unit can be equalized even in a case where the number of carriers, carrier placement and temperature inside the apparatus vary. As a result, adaptive control can be performed in excellent fashion.

A third adaptive control apparatus according to the present invention comprises ① a delay unit for delaying at least one of a reference signal and feedback signal by a set delay time in such a manner that the reference signal and feedback signal will be input simultaneously to an error calculation unit; ② a delay-time acquisition unit for acquiring the delay time based upon a prescribed carrier frequency if the reference signal, in which result of adaptive control has been reflected, is carried by a carrier of the prescribed frequency; and ③ a delay-time setting unit for setting the acquired delay time in the delay unit. In accordance with this adaptive control apparatus, the delay time until the reference signal arrives at a difference calculation unit and the delay time until the feedback signal arrives at the a difference calculation unit can be equalized even if the carrier frequency varies. As a result, adaptive control can be performed in excellent fashion.

A fourth adaptive control apparatus according to the present invention comprises ① a delay-time-difference detecting unit for measuring the difference between delay times it takes for a reference signal and feedback signal to enter an error calculation unit, measurement being performed while changing the frequency of the reference signal; ② a delay-time-difference characteristic creating unit for creating a reference-signal frequency vs. delay-time-difference characteristic; ③ a complex filter for applying prescribed filtering processing to the feedback signal and inputting the resultant signal to the error calculation unit; and a coefficient decision unit for deciding complex filter coefficients so as obtain a characteristic that is the inverse of the delay-time-difference characteristic and setting these coefficients in the complex filter. In accordance with this adaptive control apparatus, the reference signal and feedback signal can be made to arrive at the difference calculation unit simultaneously even in a case where the frequency component of the reference signal varies. This makes it possible to perform adaptive control in excellent fashion.

BRIEF DESCRIPTION OF THE DRAWINGS

FIG. 18 is a diagram useful in describing an eighth embodiment;

DESCRIPTION OF THE PREFERRED EMBODIMENTS

(A) First Embodiment

Figure 1:
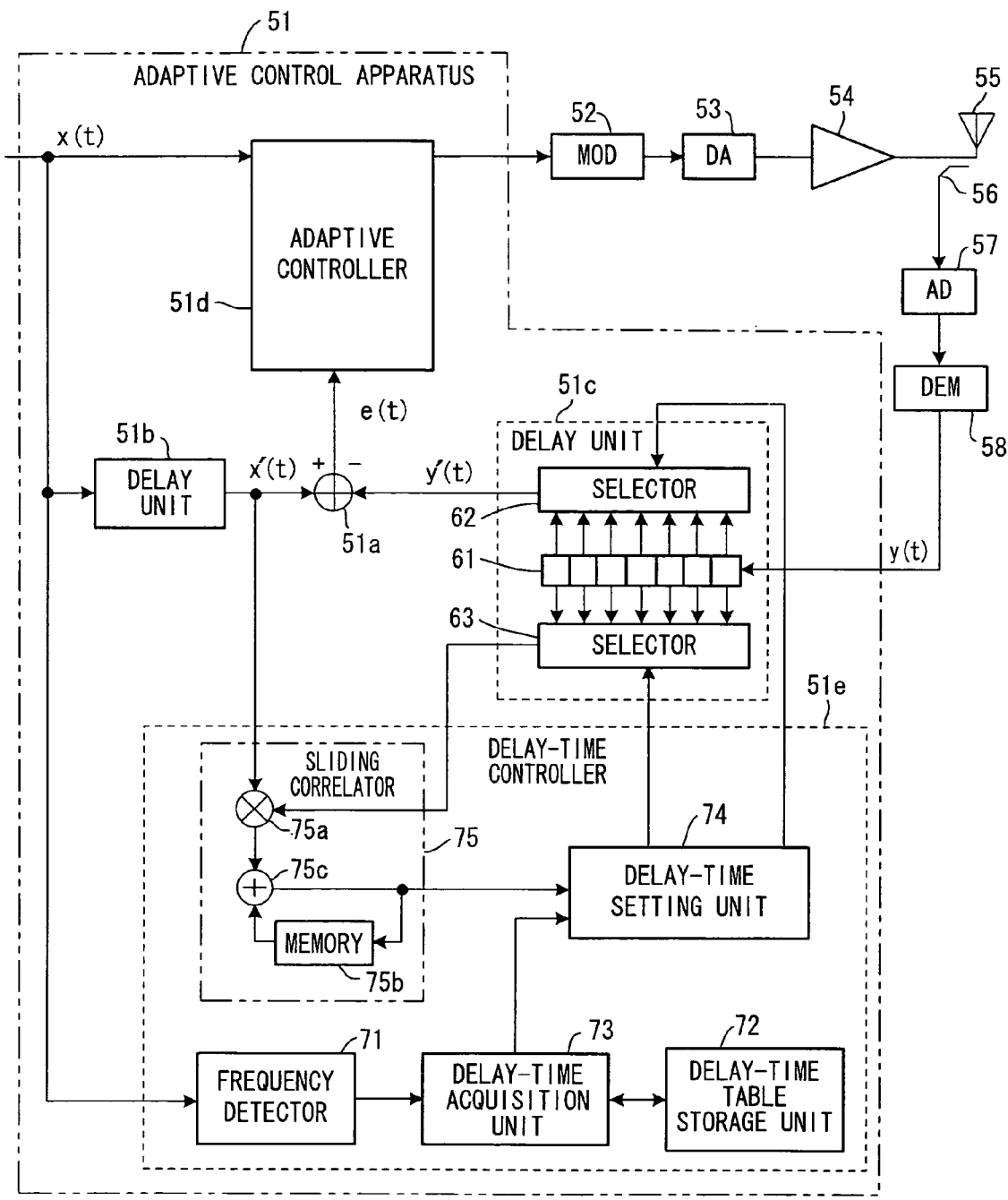
FIG. 1 is a block diagram of an adaptive control apparatus according to a first embodiment.

FIG. 1 is a block diagram of an adaptive control apparatus according to a first embodiment. This is an example in which the invention is applied to a case where compensation is made for distortion in a power amplifier.

An adaptive control apparatus 51 includes an error calculation unit 51a for calculating the difference between the transmit signal x(t), which is a reference signal, and the feedback signal y(t); delay units 51b, 51c for delaying these signals so as to null the delay-time difference between the reference signal and the feedback signal that are input to the error calculation unit 51a; an adaptive controller 51d for performing adaptive control so as to diminish the error e(t) and for causing the result of adaptive control to be reflected in the reference signal; and a delay-time controller 51e for controlling the delay time of the delay unit 51c and exercising control in such a manner that the reference signal and feedback signal will enter the error calculation unit 51a simultaneously.

The delay unit 51c has a shift register 61 for storing the digital feedback signal y(t), which arrives at the clock period, while successively shifting the signal; a first selector 62 for extracting the transmit signal from a prescribed shift position of the shift register 61 and inputting it to the error calculation unit 51a; and a second selector 63 for extracting the transmit signal from a prescribed shift position of the shift register 61 and inputting it to a correlator in the delay-time controller 51e. The second selector 63 controls the delay-time difference with respect to the transmit signal by changing over the position of the shift register 61 for extracting the feedback signal y(t). The shift length of the shift register 61 is decided so as to be greater than the maximum delay time between the reference signal and feedback signal. The feedback signal is delayed by m·T (where T represents the clock period) at the mth shift position from the leading end.

The delay-time controller 51e has a frequency detector 71, a delay-time table storage unit 72, a delay-time acquisition unit 73, a delay-time setting unit 74 and a sliding correlator 75.

The frequency detector 71, which is constituted by an FFT or the like, detects the frequency component of the reference signal x(t). The delay-time table storage unit 72 stores, in association with reference-signal frequency, the difference between the delay times it takes for the reference signal and feedback signal, respectively, to enter the error calculation unit 51a. Since the difference between the delay times it takes for the reference signal and feedback signal, respectively, to enter the error calculation unit 51a varies depending upon the frequency component (frequency, bandwidth, etc.) of the reference signal, this relationship is measured in advance and the delay-time differences are registered in the delay-time table storage unit 72 beforehand in association with the frequencies of the reference signal.

The delay-time acquisition unit 73 extracts the delay-time difference that conforms to the frequency component of the reference signal from the delay-time table storage unit 72 and inputs it to the delay-time setting unit 74. The latter initially sets the delay time that has entered from the delay-time acquisition unit 73 in the first selector 62. Further, in order to obtain the maximum correlation, the delay-time setting unit 74 controls the second selector 63 of the delay unit 51c and changes over the shift position of the shift register 61 that extracts the feedback signal y(t), thereby changing the delay time of the feedback signal. The delay-time setting unit 74 stores the correlation value calculated by the sliding correlator 75 at each delay time, obtains the delay time for which the correlation value is maximized and sets this delay time in the first selector 62 of the delay unit 51c again.

The sliding correlator 75 multiplies the transmit signal, which has been delayed by a prescribed period of time, and the feedback signal, which is output from the delay unit 51c, together one clock at a time, accumulates the results of multiplication and calculates the correlation between both signals. The sliding correlator 75 comprises a multiplier 75a, a 1-clock delay device 75b, and an adder 75c for adding the accumulated value thus far and the present result of multiplication and outputs the result.

Overall operation will now be described.

When a transmit signal is input, the adaptive controller 51d inputs a signal, which is obtained by reflecting the result of adaptive control in the reference signal x(t), to a modulator 52. The latter applies modulation processing to the input signal, a DA converter 53 converts the modulated signal to an analog signal and inputs the analog signal to a power amplifier 54, and the power amplifier 54 amplifies the input signal and then releases it into space from an antenna 55. A directional coupler 56 extracts part of the output of the power amplifier and inputs it to a demodulator 58 via an AD converter 57. The demodulator 58 applies demodulation processing to the input signal and inputs the demodulated signal to the adaptive control apparatus 51.

Further, when the transmit signal is input, the frequency detector 71 detects the frequency component of the reference signal and the delay-time acquisition unit 73 acquires the delay time that conforms to the frequency component of the reference signal from the delay-time table storage unit 72 and inputs this delay time to the delay-time setting unit 74. The latter initially sets the delay time that has entered from the delay-time acquisition unit 73 in the first selector 62 of the delay unit 51c. As a result, the feedback signal y(t) is delayed by the delay time that has been set in the delay unit 51c and the overall delay time of the feedback signal becomes substantially equal to the overall delay time it takes for the reference signal x(t) to arrive at the error calculation unit 51a via the delay unit 51b.

The error calculation unit 51a calculates the difference e(t) between reference signal x'(t) and feedback signal y'(t) that enter via the delay units 51b, 51c, and the adaptive controller 51d performs adaptive control so as to diminish the difference e(t) and causes the result of adaptive control to be reflected in the next reference signal. This operation is thenceforth repeated. By virtue of the control above, the delay times of the reference signal and feedback signal can be made equal and therefore excellent adaptive control becomes possible and distortion in the power amplifier can be compensated for in excellent fashion.

Fine adjustment of delay time is performed in parallel with the above operation. Specifically, in order to obtain the maximum correlation, the delay-time setting unit 74 controls the second selector 63 of the delay unit 51c and changes over the shift position of the shift register 61 that extracts the feedback signal y(t), thereby changing the delay time of the feedback signal. The delay-time setting unit 74 stores the correlation value calculated by the sliding correlator 75 at each delay time, obtains the delay time for which the correlation value is maximized and sets this delay time in the first selector 62 of the delay unit 51c again.

It will suffice if the shift range for when the maximum correlation is obtained is a small range in the neighborhood of the initially set delay time. As a result, the delay time of the delay unit 51c is finely adjusted quickly in real time and the arrival times of the feedback signal and reference signal at the error calculation unit can be made to agree with high precision, thereby making possible excellent adaptive control.

(B) Second Embodiment

Figure 2:
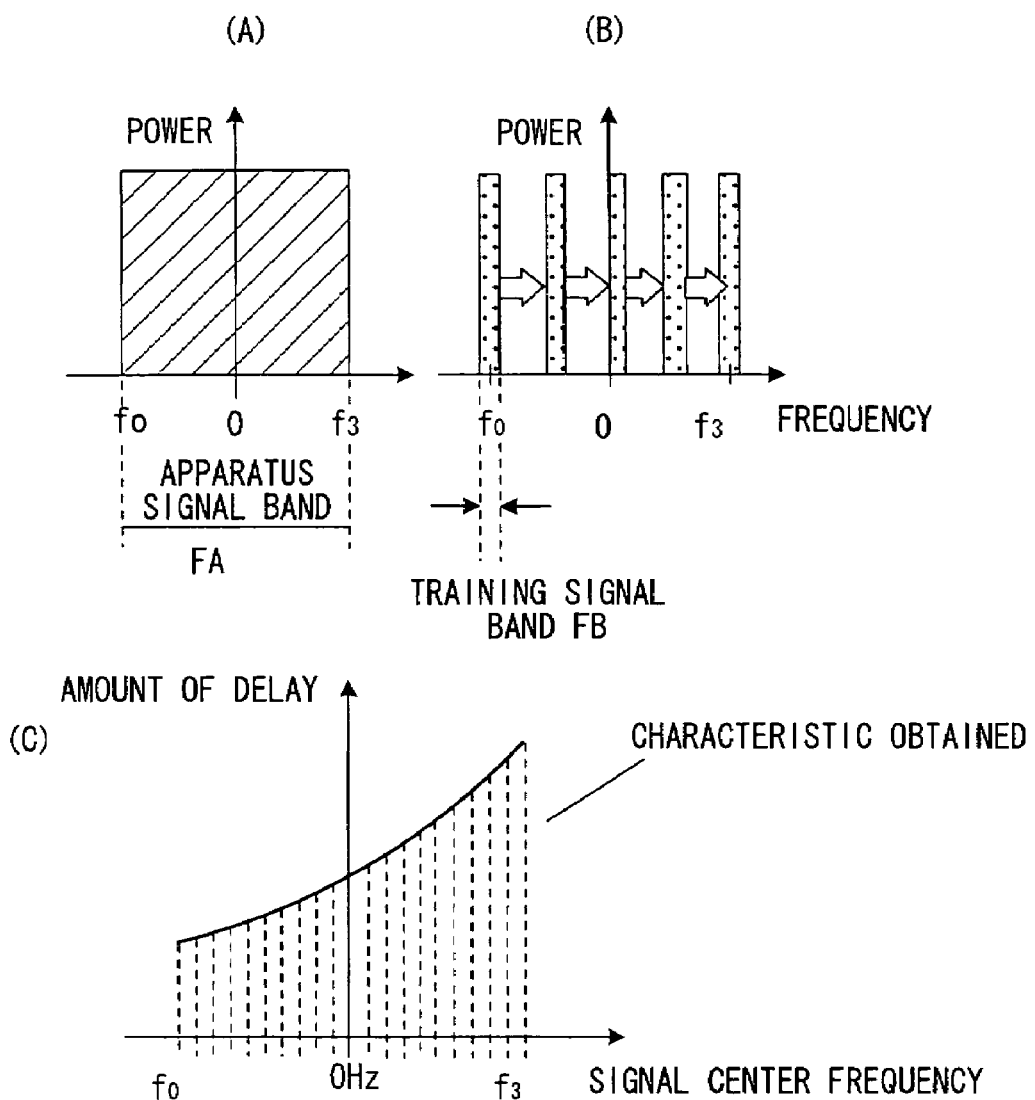
FIG. 2 is a diagram useful in describing the principle of creation of a delay-time table.

According to the first embodiment, it is described that a table that indicates the correlation between reference-signal frequencies and delay times is obtained in advance and registered in the delay-time table storage unit 72. In a second embodiment, however, this table is created and delay time is subsequently controlled by a method similar to that of the first embodiment. FIG. 2 is a diagram useful in describing the principle of creation of a delay-time table. It is assumed that the signal band of the apparatus is FA, which extends from $f_0$ to $f_3$, as shown in (A) of FIG. 2. Training signals are input to the apparatus. The training signals are such that the center frequency gradually increases from $f_0$ to $f_3$ in a bandwidth FB shown at (B) in FIG. 2. A delay-time difference for which the correlation value is maximized is obtained with respect to each training signal. If this is plotted, a frequency vs. delay characteristic shown at (C) of FIG. 2 is obtained. It is assumed that the training signal is one that employs a narrow-band signal with respect to the signal band of the apparatus. In addition, FA≧FB holds, where FA represents the band of the apparatus signal and FB the band of the training signal.

Figure 3:
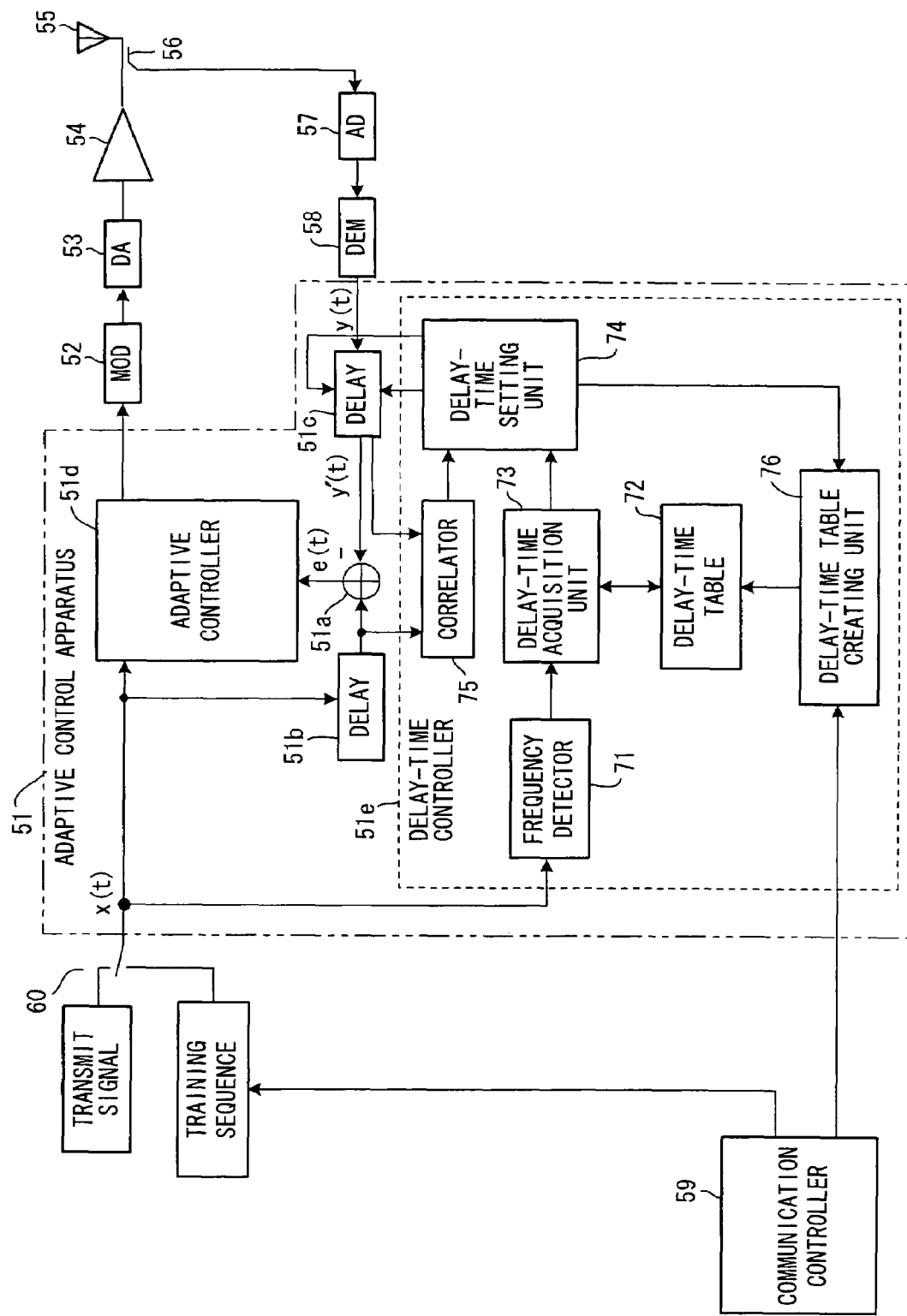
FIG. 3 is a block diagram of an adaptive control apparatus according to a second embodiment.

FIG. 3 is a block diagram of an adaptive control apparatus according to the second embodiment, in which components identical with those of the first embodiment in FIG. 1 are designated by like reference characters. This embodiment differs in that it is additionally provided with components for creating a delay-time table, such as a communication controller 59, switch 60 and delay-time table creating unit 76. The delay unit 51c has a structure identical with that of the delay unit 51c in FIG. 1.

The delay-time table is created before the transmit signal is transmitted. The communication controller 59 exercises control in such a manner that the training signal is selected by the switch 60 and instructs the delay-time controller 51e to create the delay-time table. The communication controller 59 then generates a first training signal having a center frequency $f_0$ and inputs the center frequency $f_0$ to the delay-time table creating unit 76.

In order to obtain the maximum correlation, the delay-time setting unit 74 controls the second selector 63 (see FIG. 1) of the delay unit 51c and changes over the shift position of the shift register 61 that extracts the feedback signal y(t), thereby changing the delay time of the feedback signal. The delay-time setting unit 74 stores the correlation value calculated by the sliding correlator 75 at each delay time, obtains the delay time for which the correlation value is maximized and inputs this delay time to the delay-time table creating unit 76. The latter stores the entered delay time in association with the center frequency $f_0$. The communication controller 59 thenceforth generates the narrow-band training signals in such a manner that frequency increases successively from $f_0$ to $f_3$, and the delay-time table creating unit 76 stores the obtained delay times in association with the frequencies in the manner described above. When frequency vs. delay times are obtained with regard to the full band, these are set in the delay-time table storage unit 72, thereby completing the processing for creating the table. The communication controller 59 causes the transmit signal to be selected by the switch according to the table. Delay-time control and adaptive control is thenceforth carried out in a manner similar to that of the first embodiment.

(C) Third Embodiment

The first and second embodiments put the correspondence between reference-signal frequency and delay time into table form, obtains delay time from the table and sets it in the delay unit. However, it can also be so arranged that correspondence between frequencies at several points and delay times is stored, the correspondence between these is linearized and expressed by a linear equation, delay time is obtained by calculation and then is set in the delay unit.

Figure 4:
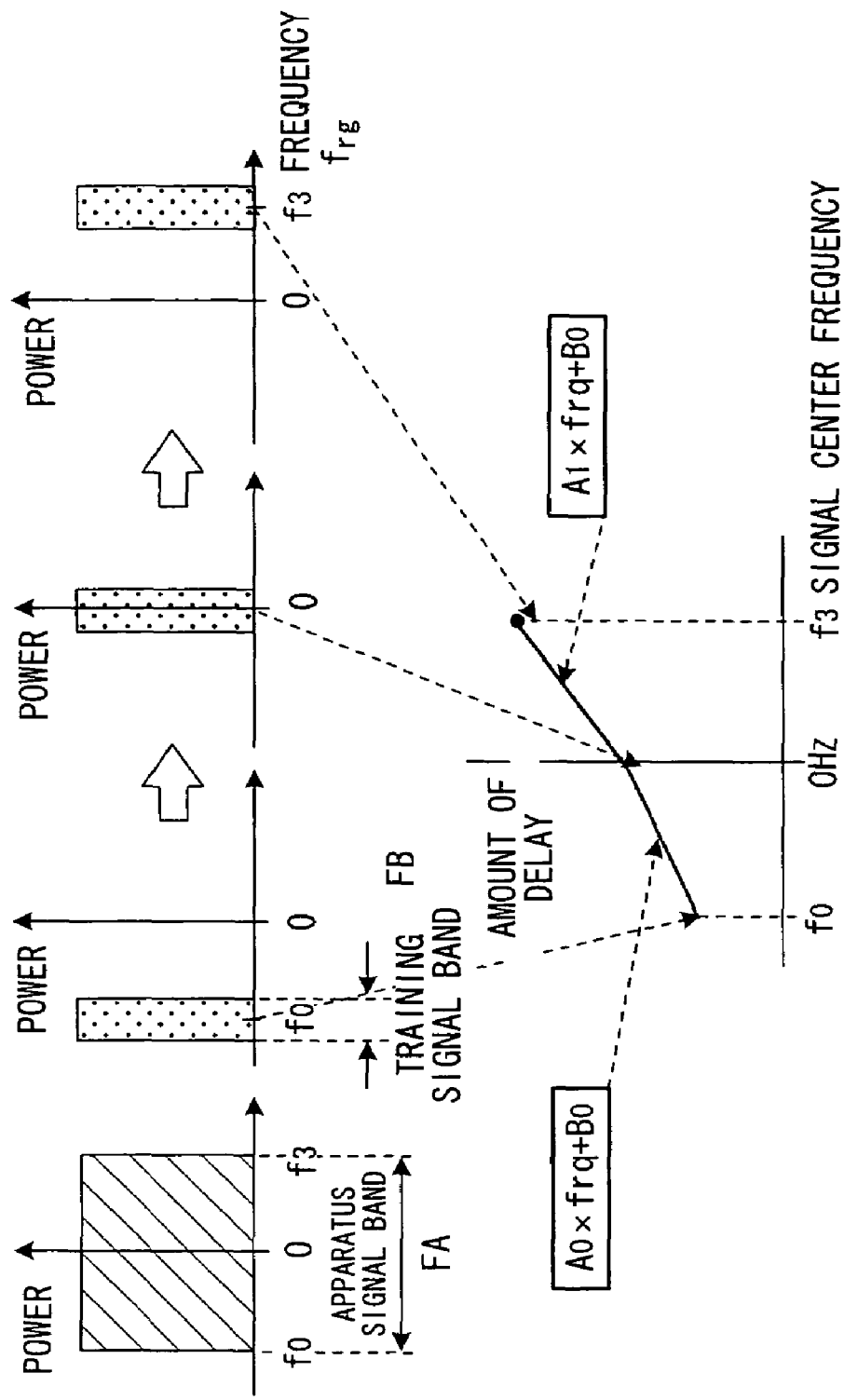
FIG. 4 is a diagram useful in describing a third embodiment.

FIG. 4 is a diagram useful in describing a third embodiment. Here the center frequency of the training signals is varied in the manner $f_0$, 0, $f_3$ and the delay times (amount of delay) of the feedback signal are found and stored when the center frequencies prevail. Two linear equations ($A_0 \times frq + B_0$, $A_1 \times frq + B_1$) involving center frequency and amount of delay are generated using the three sets of center frequencies and amounts of delay found, amount of delay conforming to the reference-signal frequency is found from a prescribed equation when the reference-signal frequency is changed, and this amount of delay is set in the delay unit.

Figure 5:
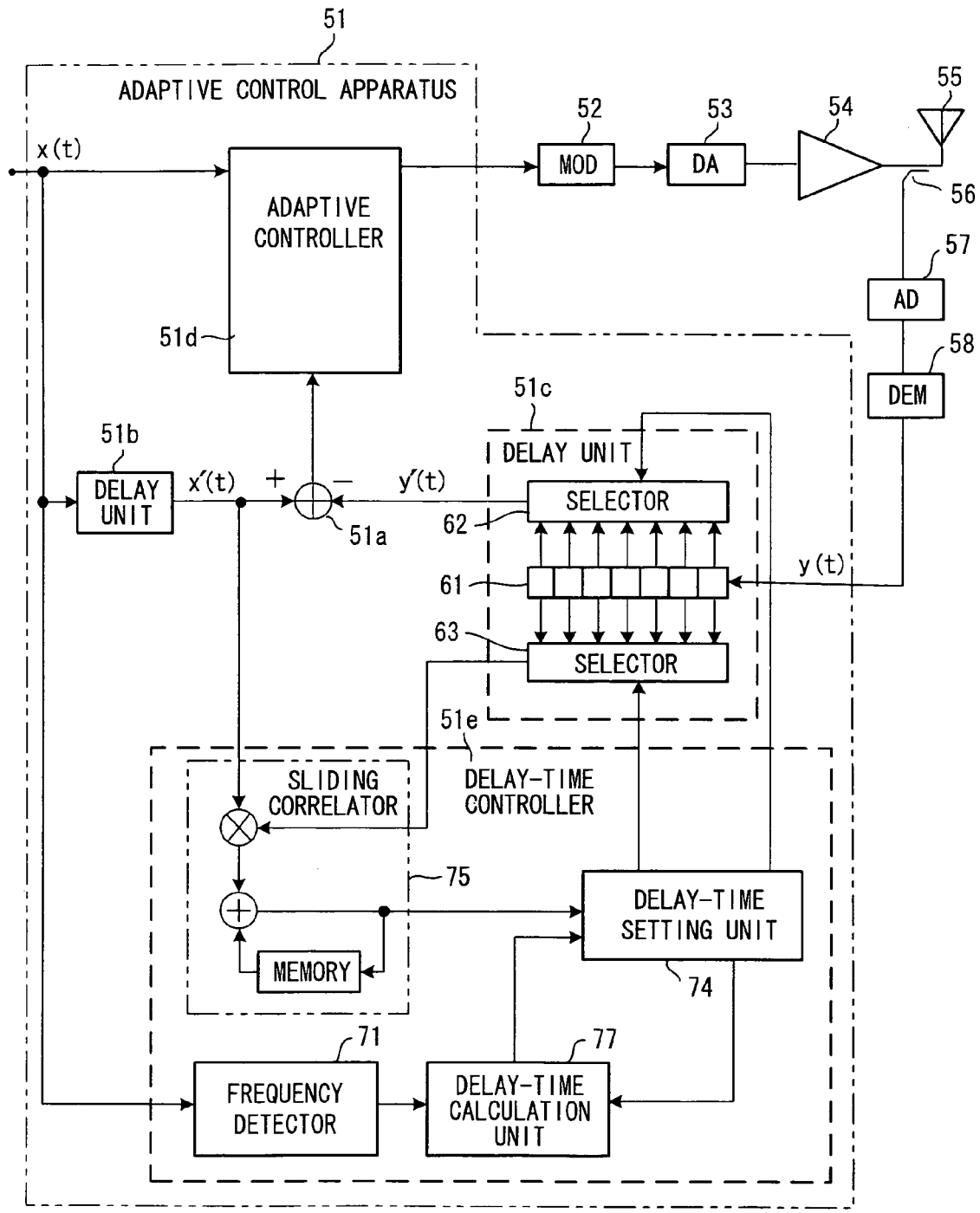
FIG. 5 is a block diagram of an adaptive control apparatus according to a third embodiment.

FIG. 5 is a block diagram of an adaptive control apparatus according to the third embodiment, in which components identical with those of the first embodiment in FIG. 1 are designated by like reference characters. This embodiment differs in that a delay-time calculation unit 77 is provided so that delay time may be obtained by calculation. Before a transmit signal is transmitted, training signals are input and delay times conforming to several frequencies are obtained by the method shown in FIG. 3, and these are input to the delay-time calculation unit 77 in advance.

If a transmit signal is input under these conditions, the adaptive controller 51d inputs a signal, which is obtained by reflecting the results of adaptive control in the reference signal x(t), to the modulator 52. The latter applies modulation processing to the input signal, the DA converter 53 converts the modulated signal to an analog signal and inputs the analog signal to the power amplifier 54, and the power amplifier 54 amplifies the input signal and then releases it into space from the antenna 55. The directional coupler 56 extracts part of the output of the power amplifier and inputs it to the demodulator 58 via the AD converter 57. The demodulator 58 applies demodulation processing to the input signal and inputs the demodulated signal to the adaptive control apparatus 51.

Further, when the transmit signal is input, the frequency detector 71 detects the frequency component of the reference signal and inputs it to the delay-time calculation unit 77. The latter calculates delay time using a linear equation conforming to a range to which the frequency component of the reference signal belongs and inputs this delay time to the delay-time setting unit 74. The latter initially sets the delay time that has entered from the delay-time calculation unit 77 in the first selector 62 of the delay unit 51c.

As a result, the feedback signal y(t) is delayed by the delay unit 51c in accordance with the set delay time and the overall delay time of the feedback signal becomes substantially equal to the overall delay time it takes for the reference signal x(t) to arrive at the error calculation unit 51a via the delay unit 51b.

The error calculation unit 51a calculates the difference e(t) between the reference signal x'(t) and the feedback signal y'(t) that enter via the delay units 51b, 51c, and the adaptive controller 51d performs adaptive control so as to diminish the difference e(t) and causes the result of adaptive control to be reflected in the next reference signal. This operation is thenceforth repeated. By virtue of the control above, the delay times of the reference signal and feedback signal can be made equal and therefore excellent adaptive control becomes possible.

Fine adjustment of delay time is performed in parallel with the above operation by a method similar to that of the first embodiment. Specifically, in order to obtain the maximum correlation, the delay-time setting unit 74 controls the second selector 63 (see FIG. 1) of the delay unit 51c and changes over the shift position of the shift register 61 that extracts the feedback signal y(t), thereby changing the delay time of the feedback signal. The delay-time setting unit 74 stores the correlation value calculated by the sliding correlator 75 at each delay time, obtains the delay time for which the correlation value is maximized and sets this delay time in the first selector 62 of the delay unit 51c again.

It will suffice if the shift range for when the maximum correlation is obtained is a small range in the neighborhood of the initially set delay time. As a result, the delay time of the delay unit 51c is finely adjusted quickly in real time and the arrival times of the feedback signal and reference signal at the error calculation unit can be made to agree with high precision, thereby making possible excellent adaptive control.

(D) Fourth Embodiment

Figure 6:
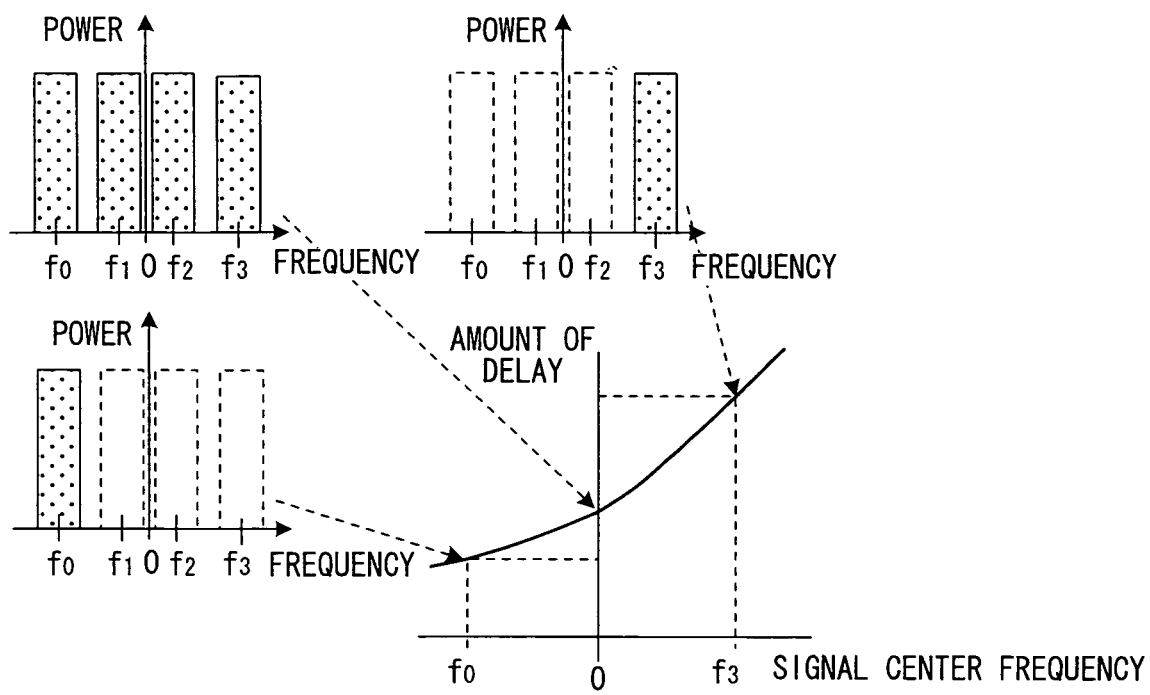
FIG. 6 is a diagram useful in describing a delay-time characteristic that conforms to a center frequency specified by number of carriers and carrier placement.

The first to third embodiments are for a case where transmission is by a single carrier. However, there are also cases where transmission is performed using a multicarrier signal. In such cases, the delay time of the feedback signal y(t) varies in accordance with a center frequency specified by number of carriers (which corresponds to the bandwidth used) and carrier placement, as shown in FIG. 6. According to a fourth embodiment, delay times are measured beforehand and registered in a delay-time table storage unit in association with combinations of number of carriers and carrier placement, or in association with center frequencies, a delay time that corresponds to an actual combination of number of carriers and carrier placement or to center frequency is found from the table and this is set in the delay unit.

Figure 7:
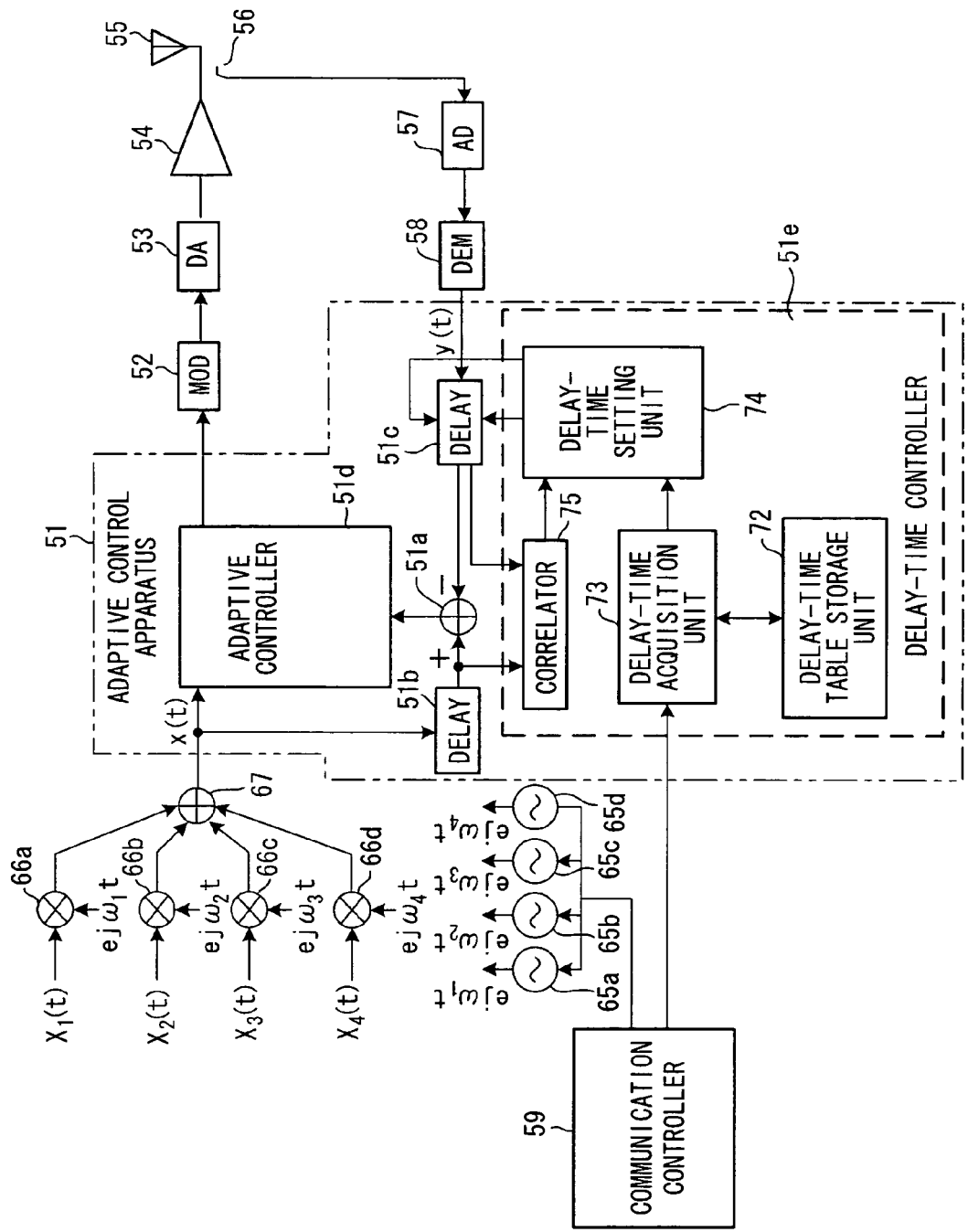
FIG. 7 is a block diagram of a fourth embodiment.

FIG. 7 is a block diagram of the fourth embodiment, in which components identical with those of the first embodiment in FIG. 1 are designated by like reference characters. This embodiment differs from the first embodiment in the following points:

① n-number (where n=4 holds) of frequencies are multiplexed and transmitted (i.e., multicarrier transmission is performed);

② a delay-time table that holds delay times in association with combinations of number of carriers and carrier placement or in association with center frequencies specified by numbers of carriers and carrier placement is registered in the delay-time table storage unit 72; and ③ the delay-time acquisition unit 73 acquires a combination of number of carriers and carrier placement or the center frequency from the communication controller 59, acquires the delay time corresponding to these from the delay-time table and inputs it to the delay-time setting unit 74.

It should be noted that the delay unit 51c has a structure identical with that of the delay unit 51c in FIG. 1.

Frequency generators 65a to 65d are turned on/off under the control of the communication controller 59 and generate frequency signals of $\exp(j\omega_1 t)$ to $\exp(j\omega_4 t)$ ($\omega_n = 2\pi f_n$), respectively.

If transmit signals $x_1(t)$ to $x_4(t)$ are input under these conditions, frequency shifters 66a to 66d multiply the digital transmit signals $x_1(t)$ to $x_4(t)$ by respective ones of the signals $\exp(j\omega_1 t)$ to $\exp(j\omega_4 t)$ ($\omega_n = 2\pi f_n$), thereby applying a frequency shift to the frequencies $f_1$ to $f_4$, and a combiner 67 multiplexes the frequencies. The digital frequency-multiplexed transmit signal x(t) corresponds to the single-carrier transmit signal x(t). This is followed by performing adaptive control and delay-time control similar to that of the case of the single carrier.

The adaptive controller 51*d* inputs a signal, which is obtained by reflecting the result of adaptive control in the reference signal x(t), to the modulator 52. The latter applies modulation processing to the input signal, the DA converter 53 converts the modulated signal to an analog signal and inputs the analog signal to the power amplifier 54, and the power amplifier 54 amplifies the input signal and then releases it into space from the antenna 55. The directional coupler 56 extracts part of the output of the power amplifier and inputs it to the demodulator 58 via the AD converter 57. The demodulator 58 applies demodulation processing to the input signal and inputs the demodulated signal to the adaptive control apparatus 51.

Further, the delay-time acquisition unit 73 acquires a combination of number of carriers and carrier placement or a center frequency specified by number of carriers and carrier placement from the communication controller 59. Next, the delay-time acquisition unit 73 acquires a delay time that corresponds to the acquired combination of number of carriers and carrier placement or center frequency from the delay-time table storage unit 72 and inputs it to the delay-time setting unit 74. The latter initially sets the delay time that has entered from the delay-time acquisition unit 73 in the first selector 62 (see FIG. 1) of the delay unit 51*c*. As a result, the feedback signal y(t) arrives at the error calculation unit 51*a* upon being delayed by the delay unit 51*c* in accordance with the set delay time. Accordingly, the overall delay time of the feedback signal becomes substantially equal to the overall delay time it takes for the transmit signal x(t), which is the reference signal, to arrive at the error calculation unit 51*a* via the delay unit 51*b*.

The error calculation unit 51*a* calculates the difference e(t) between the reference signal x'(t) and the feedback signal y'(t) that enter via the delay units 51*b*, 51*c*, and the adaptive controller 51*d* performs adaptive control so as to diminish the difference e(t) and causes the result of adaptive control to be reflected in the next transmit signal. This operation is thenceforth repeated. By virtue of the control above, the delay times of the reference signal and feedback signal can be made equal and therefore excellent adaptive control becomes possible.

Fine adjustment of delay time is performed in parallel with the above operation by a method similar to that of the first embodiment. Specifically, in order to obtain the maximum correlation, the delay-time setting unit 74 controls the second selector 63 (see FIG. 1) of the delay unit 51*c* and changes over the shift position of the shift register 61 that extracts the feedback signal y(t), thereby changing the delay time of the feedback signal. The delay-time setting unit 74 stores the correlation value calculated by the sliding correlator 75 at each delay time, obtains the delay time for which the correlation value is maximized and sets this delay time in the first selector 62 of the delay unit 51*c* again. It will suffice if the shift range for when the maximum correlation is obtained is a small range in the neighborhood of the initially set delay time. As a result, the delay time of the delay unit 51*c* is finely adjusted quickly in real time and the arrival times of the feedback signal and reference signal at the error calculation unit can be made to agree with high precision, thereby making possible excellent adaptive control.

Delay time is acquired from table in the description rendered above. However, delay time can also be acquired using a calculation formula for calculating delay time from number of carriers and carrier placement in a manner similar to that of the third embodiment. For example, amounts of delay corresponding to center frequencies of a multicarrier are found discretely beforehand, a calculation formula for calculating amount of delay from center frequency is set up using these amounts of delay, center frequency is obtained from the actual number of carriers and carrier placement and the amount of delay is calculated using this calculation formula.

(D) Fifth Embodiment

Figure 8:
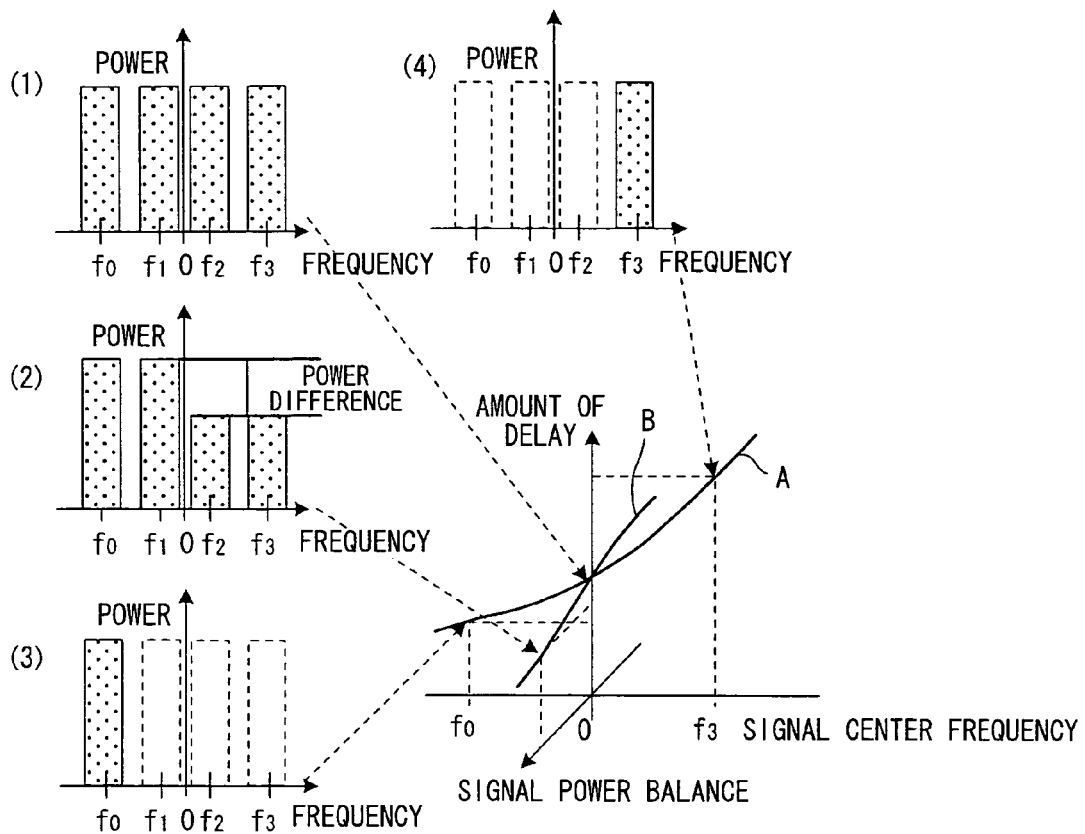
FIG. 8 is a characteristic curve that indicates the relationship between power and amount of delay.
Figure 9:
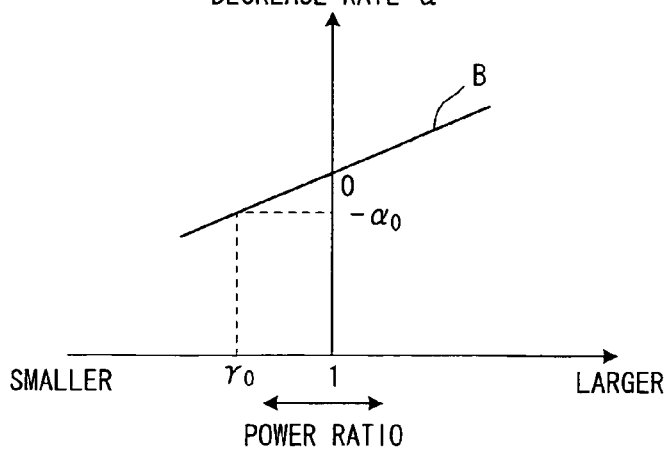
FIG. 9 is a characteristic of power ratio vs. rate of increase/decrease in amount of delay.

The delay time of a feedback signal varies depending upon the number of carriers and carrier placement and varies also in dependence upon the power of each carrier. In FIG. 8, A represents a characteristic curve that indicates the relationship between carrier center frequency and amount of delay, and B represents a characteristic curve indicating the relationship between power and amount of delay. If the amounts of delay at (1), (2) for the same number of carriers but different power are compared, it will be understood that the amount of delay at (1) is larger than that at (2) for which power at $f_2$, $f_3$ on the high-frequency side of the center frequency is small. Accordingly, in the fifth embodiment, there are provided a first table indicating amounts of delay corresponding to combinations of number of carriers and carrier placement or center frequencies specified by these, and a second table indicating increase or decrease in amounts of delay corresponding to ratios between power on the high-frequency side and power on the low-frequency side of the center frequency (=high-frequency-side power/low-frequency-side power), and amounts of delay are acquired from these tables. As shown in FIG. 9, a curve B is a characteristic of power ratio vs. rate of increase/decrease in amount of delay. If the power ratio is $\gamma_0$, the rate of increase/decrease will be $-\alpha_0$. Therefore, if $\tau$ represents the delay time found from the first table, then delay time that takes power into account will be $\tau(1-\alpha_0)$.

Figure 10:
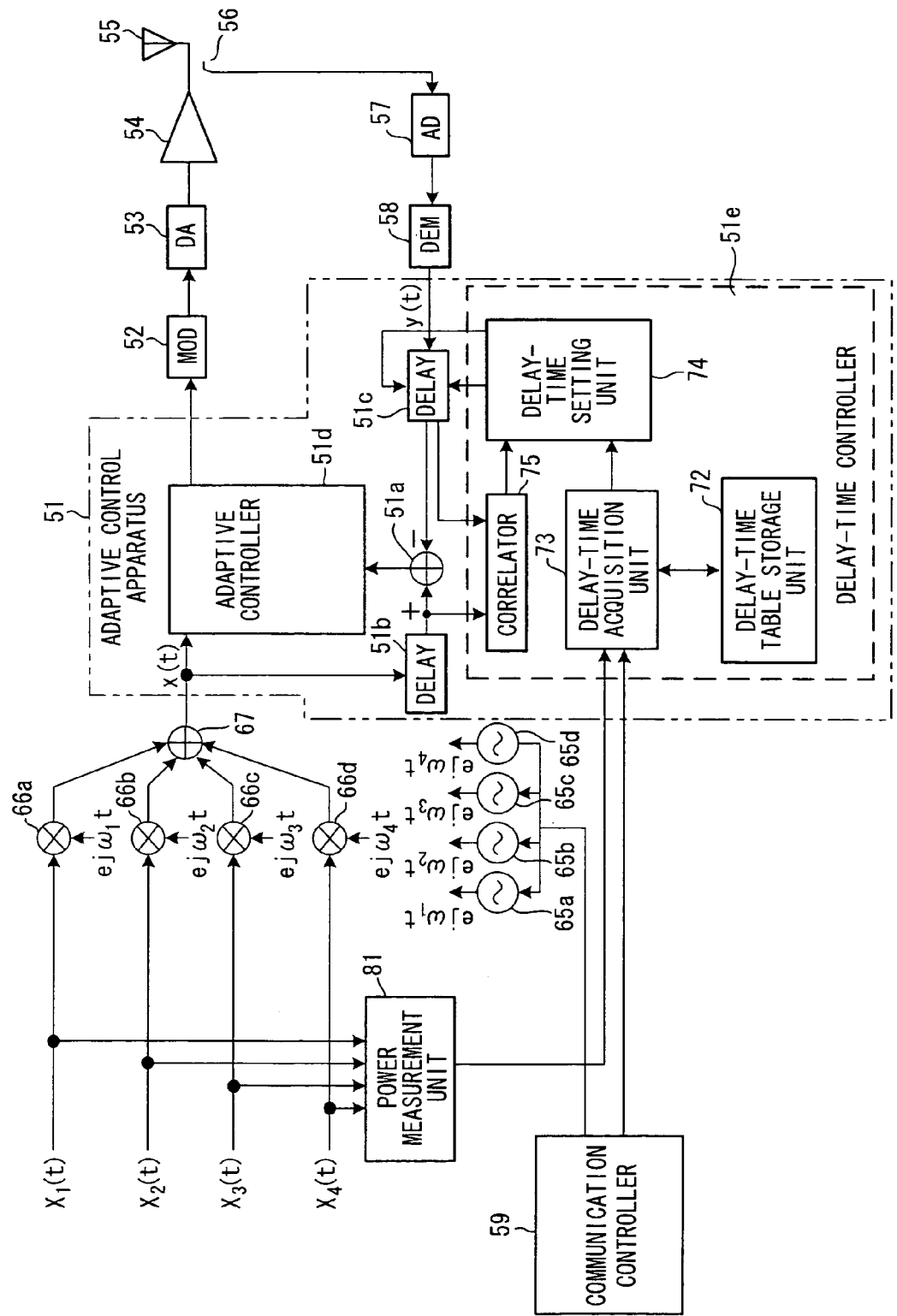
FIG. 10 is a block diagram of an adaptive control apparatus according to a fifth embodiment.

FIG. 10 is a block diagram of an adaptive control apparatus according to the fifth embodiment, in which components identical with those of the fourth embodiment of FIG. 7 are designated by like reference characters. This embodiment differs in the following points:

① the above-mentioned first and second tables are registered in the delay-time table storage unit 72;

② a power measurement unit 81 for measuring the power of each carrier is provided; and ③ the delay-time acquisition unit 73 acquires delay times based upon the two tables, namely the first and second tables.

More specifically, the delay-time acquisition unit 73 acquires, from the communication controller 59, a combination of number of carriers and carrier placement or a center frequency obtained from the number of carriers and carrier placement and acquires the delay time $\tau$ corresponding thereto from the first table. Next, the delay-time acquisition unit 73 calculates the power ratio between the high-frequency-side power and low-frequency-side power based upon the power of each carrier, obtains the rate $\alpha$ of increase/decrease in amount of delay conforming to this power ratio from the second table, finds a delay time that takes power into account according to the following formula:

$$\tau(1+\alpha)$$

and sets this in the delay-time setting unit 74. The latter initially sets the delay time that has entered from the delay-time acquisition unit 73 in the first selector 62 (see FIG. 1) of the delay unit 51*c*. As a result, the feedback signal y(t) arrives at the error calculation unit 51*a* upon being delayed by the delay unit 51*c* in accordance with the set delay time. Accordingly, the overall delay time of the feedback signal becomes substantially equal to the overall delay time it takes for the transmit signal x(t), which is the reference signal, to arrive at the error calculation unit 51*a* via the delay unit 51*b*.

(F) Sixth Embodiment

Figure 11:
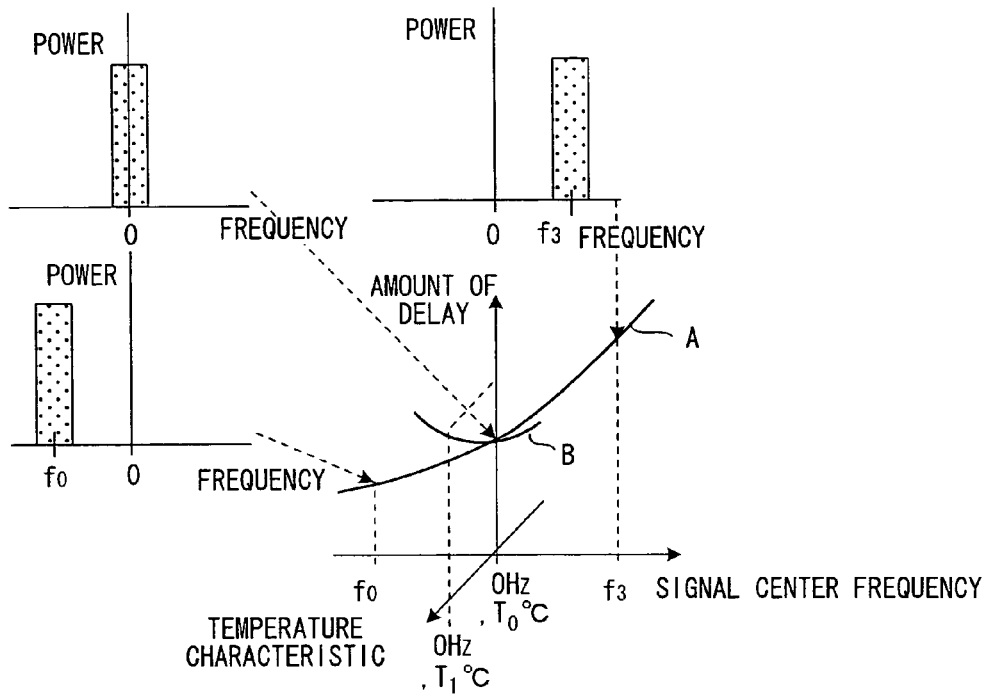
FIG. 11 is an explanatory view illustrating the relationship between temperature inside an apparatus and amount of delay.
Figure 12:
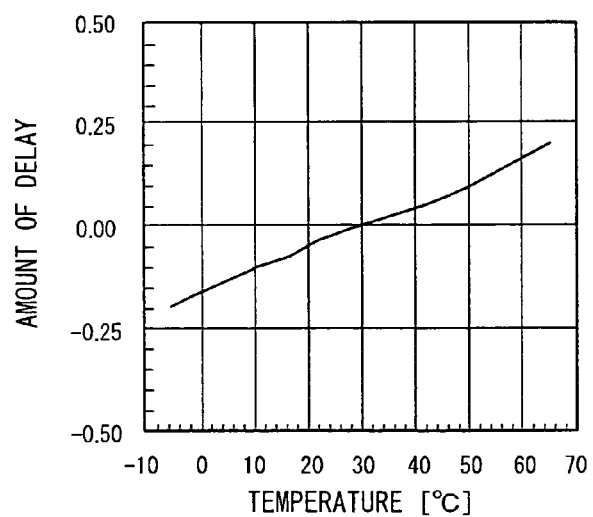
FIG. 12 is a characteristic curve indicating the relationship between actually measured temperature inside an apparatus and amount of delay.

The delay time of a feedback signal varies depending upon the number of carriers and carrier placement and varies also in dependence upon the temperature inside the apparatus. In FIG. 11, A represents a characteristic curve that indicates the relationship between carrier center frequency and amount of delay, and B represents a characteristic curve indicating the relationship between temperature in the apparatus and amount of delay. FIG. 12 is a characteristic curve indicating the relationship between temperature and amount of delay at a temperature $T_0$. It will be understood from FIGS. 11 and 12 that delay time increases when the temperature rises and decreases when the temperature falls. According, in a sixth embodiment, there are provided a first table indicating amounts of delay corresponding to combinations of number of carriers and carrier placement or center frequencies specified by these, and a second table indicating amounts of increase or decrease in amounts of delay corresponding to temperature, and amounts of delay are acquired from these tables.

Figure 13:
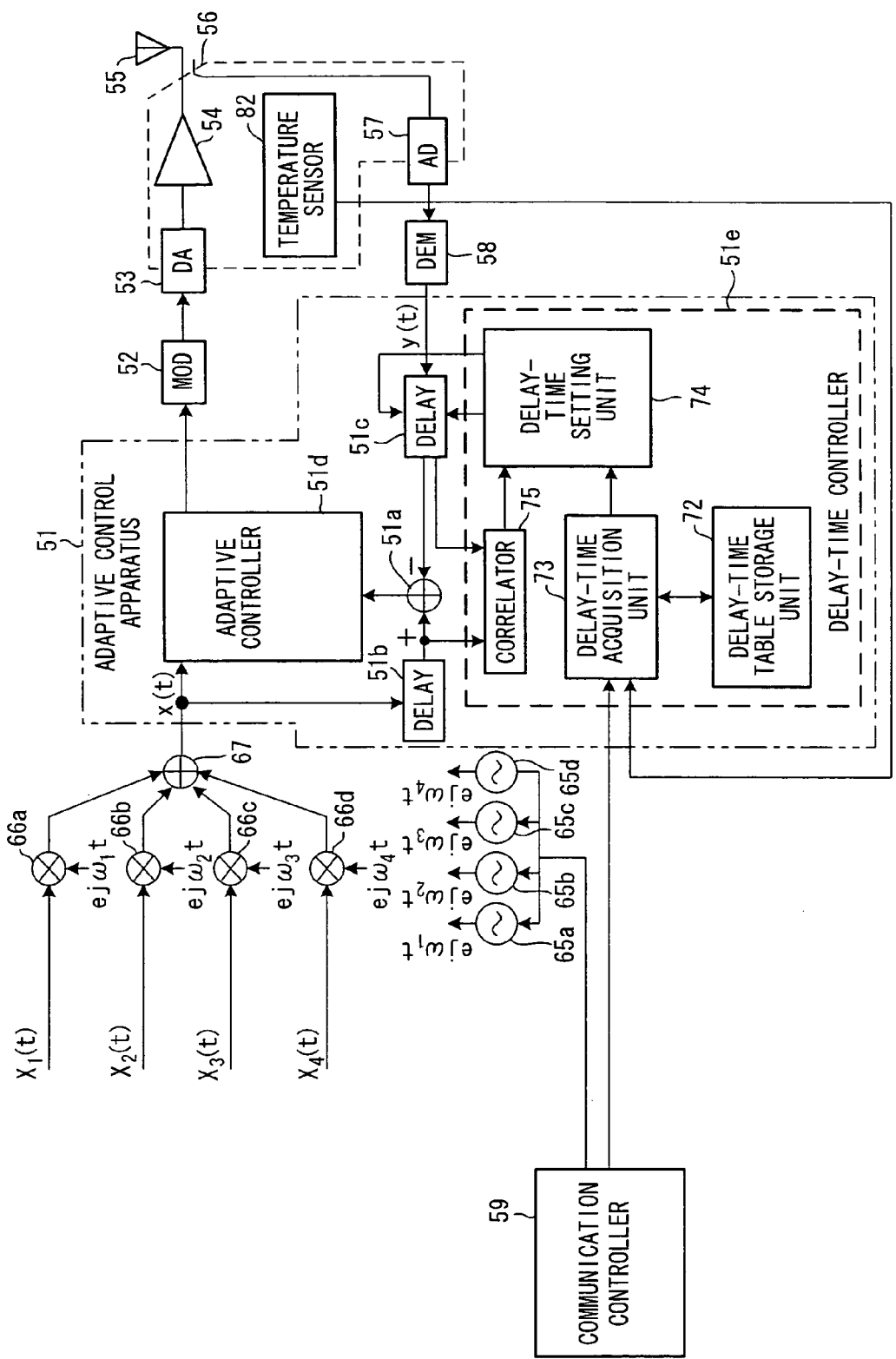
FIG. 13 is a block diagram of an adaptive control apparatus according to a sixth embodiment.

FIG. 13 is a block diagram of an adaptive control apparatus according to the sixth embodiment, in which components identical with those of the fourth embodiment of FIG. 7 are designated by like reference characters. This embodiment differs in the following points:

④ the above-mentioned first and second tables are registered in the delay-time table storage unit 72;

⑤ a temperature sensor 82 for measuring temperature inside the apparatus is provided; and ⑥ the delay-time acquisition unit 73 acquires delay times based upon a combination of number of carriers and carrier placement or center frequency specified by these, and temperature inside the apparatus.

More specifically, the delay-time acquisition unit 73 acquires, from the communication controller 59, a combination of number of carriers and carrier placement or a center frequency specified by the number of carriers and carrier placement and acquires the delay time τ corresponding thereto from the first table. Next, the delay-time acquisition unit 73 obtains, from the second table, an amount β of increase/decrease in amount of delay conforming to temperature inside the apparatus, finds a delay time that takes temperature inside the apparatus into account according to the following formula:

$$\tau+\beta$$

and sets this in the delay-time setting unit 74. The latter initially sets the delay time that has entered from the delay-time acquisition unit 73 in the first selector 62 (see FIG. 1) of the delay unit 51*c*. As a result, the feedback signal y(t) arrives at the error calculation unit 51*a* upon being delayed by the delay unit 51*c* in accordance with the set delay time. Accordingly, the overall delay time of the feedback signal becomes substantially equal to the overall delay time it takes for the transmit signal x(t), which is the reference signal, to arrive at the error calculation unit 51*a* via the delay unit 51*b*.

(F) Seventh Embodiment

Figure 14:
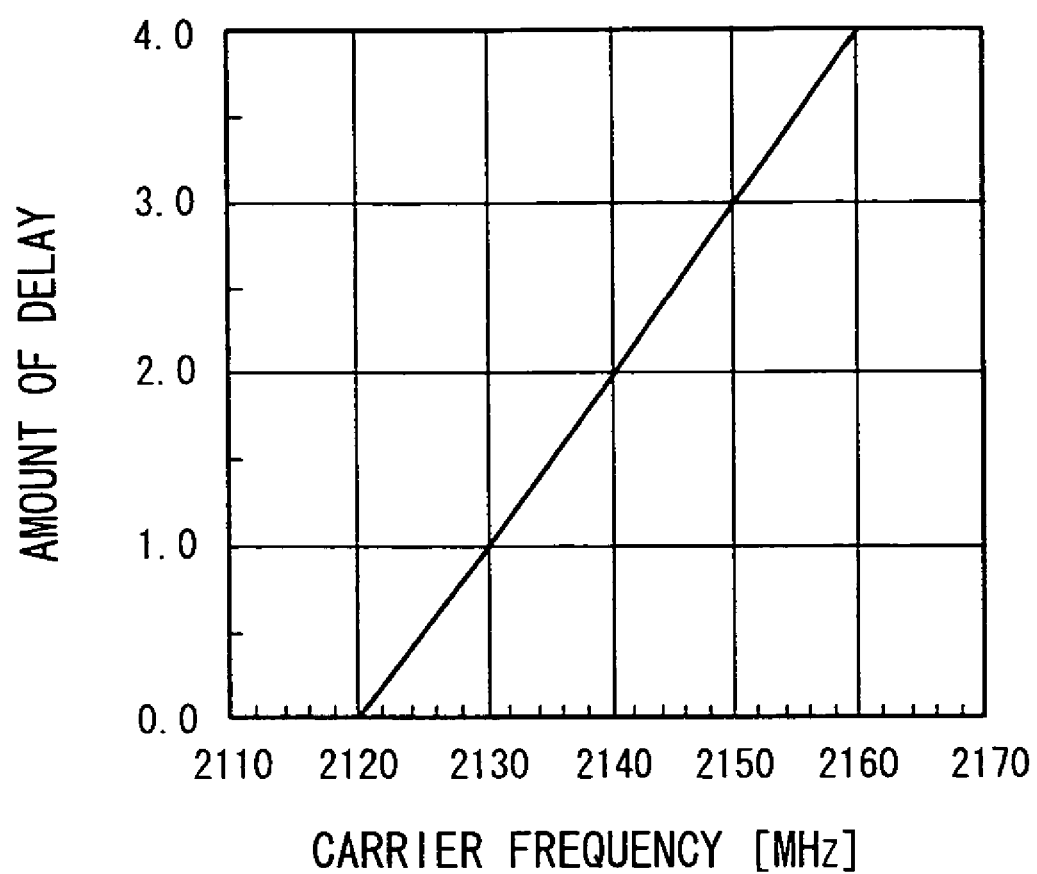
FIG. 14 is a diagram showing the relationship between carrier frequency and delay time.

The delay time of the feedback signal varies in dependence upon carrier frequency. FIG. 14 is a diagram showing the relationship between carrier frequency and delay time. The higher the carrier frequency, the greater the amount of delay. According to a seventh embodiment, the correspondence between carrier frequency and delay time is put into table form, delay time conforming to the actual carrier frequency is obtained from the table and is set in the delay unit.

Figure 15:
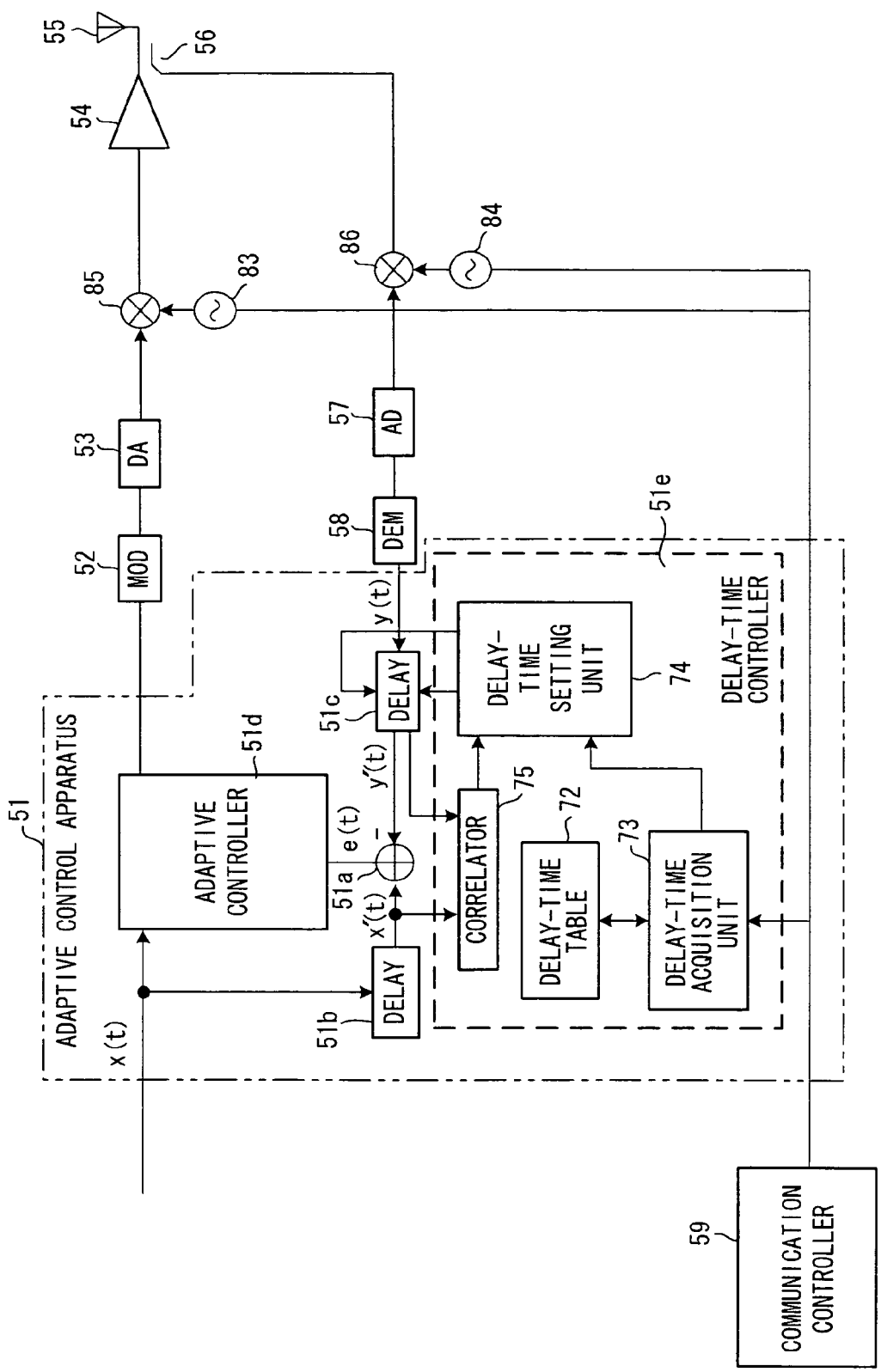
FIG. 15 is a block diagram of an adaptive control apparatus according to a seventh embodiment.

FIG. 15 is a block diagram of an adaptive control apparatus according to the seventh embodiment, in which components identical with those of the first embodiment in FIG. 1 are designated by like reference characters. This embodiment differs in the following points:

① a table indicating the correspondence between carrier frequency and delay time is registered in the delay-time table storage unit 72;

② the delay-time acquisition unit 73 acquires carrier frequency from the communication controller 59, acquires the delay time corresponding to this carrier frequency from the delay-time table and inputs this delay time to the delay-time setting unit 74; and ③ use is made of control signal information set in frequency converters 83, 85, which frequency-convert a baseband signal to an RF signal, and in frequency converters 84, 86, which frequency-convert an RF signal to a baseband signal.

It should be noted that the delay unit 51*c* has a structure identical with that of the delay unit 51*c* in FIG. 1.

If a transmit signal is input, the adaptive controller 51*d* inputs a signal, which is obtained by reflecting the results of adaptive control in the reference signal x(t), to the modulator 52. The latter applies modulation processing to the input signal and the DA converter 53 converts the modulated signal to an analog signal. An oscillator 83 of the frequency converter oscillates at the carrier frequency specified by the communication controller 59, and a multiplier 85 multiplies a baseband signal, which is output from the DA converter, by the carrier-frequency signal to effect a frequency conversion to a radio signal and inputs the radio signal to the power amplifier 54. The latter amplifies the input signal and then releases it into space from the antenna 55.

The directional coupler 56 extracts part of the output of the power amplifier, and a multiplier 86 multiplies the radio signal by a carrier-frequency signal generated by an oscillator 84, thereby effecting a frequency conversion to a baseband signal. The AD converter 57 converts the baseband signal output from the multiplier 86 to a digital signal and inputs the digital signal to the demodulator 58. The demodulator 58 applies demodulation processing to the input signal and inputs the demodulated signal to the adaptive control apparatus 51.

Meanwhile, the delay-time acquisition unit 73 obtains the carrier frequency from the communication controller 59, acquires the delay time conforming to the carrier frequency from the delay-time table storage unit 72 and sets this delay time in the delay-time setting unit 74. The latter initially sets the delay time that has entered from the delay-time acquisition unit 73 in the first selector 62 (see FIG. 1) of the delay unit 51*c*. As a result, the feedback signal y(t) arrives at the error calculation unit 51*a* upon being delayed by the delay unit 51*c* in accordance with the set delay time. Accordingly, the overall delay time of the feedback signal up to arrival at the error calculation unit 51*a* becomes substantially equal to the overall delay time it takes for the reference signal x(t) to arrive at the error calculation unit 51*a* via the delay unit 51*b*.

The error calculation unit 51*a* calculates the difference e(t) between the reference signal x'(t) and the feedback signal y'(t) that enter via the delay units 51*b*, 51*c*, and the adaptive controller 51*d* performs adaptive control so as to diminish the difference e(t) and causes the result of adaptive control to be reflected in the next reference signal. This operation is thenceforth repeated. By virtue of the control above, excellent adaptive control becomes possible.

Fine adjustment of delay time is performed in parallel with the above operation. Specifically, in order to obtain the maximum correlation, the delay-time setting unit 74 controls the second selector 63 (see FIG. 1) of the delay unit 51c and changes over the shift position of the shift register 61 that extracts the feedback signal y(t), thereby changing the delay time of the feedback signal. The delay-time setting unit 74 stores the correlation value calculated by the sliding correlator 75 at each delay time, obtains the delay time for which the correlation value is maximized and sets this delay time in the first selector 62 of the delay unit 51c again.

It will suffice if the shift range for when the maximum correlation is obtained is a small range in the neighborhood of the initially set delay time. As a result, the delay time of the delay unit 51c is finely adjusted quickly in real time and the arrival times of the feedback signal and reference signal at the error calculation unit can be made to agree with high precision, thereby making possible excellent adaptive control.

(H) Eighth Embodiment

In the above embodiments, the difference between the delay times it takes for the reference signal and feedback signal to enter the error calculation unit is obtained, the difference is set in the delay unit and control is exercised so as to null the difference. However, a characteristic of reference-signal frequency vs. delay-time difference can be created in advance, a characteristic that is the inverse of this characteristic can be set in a complex filter and control can be exercised so as to null the delay-time difference.

Figure 16:
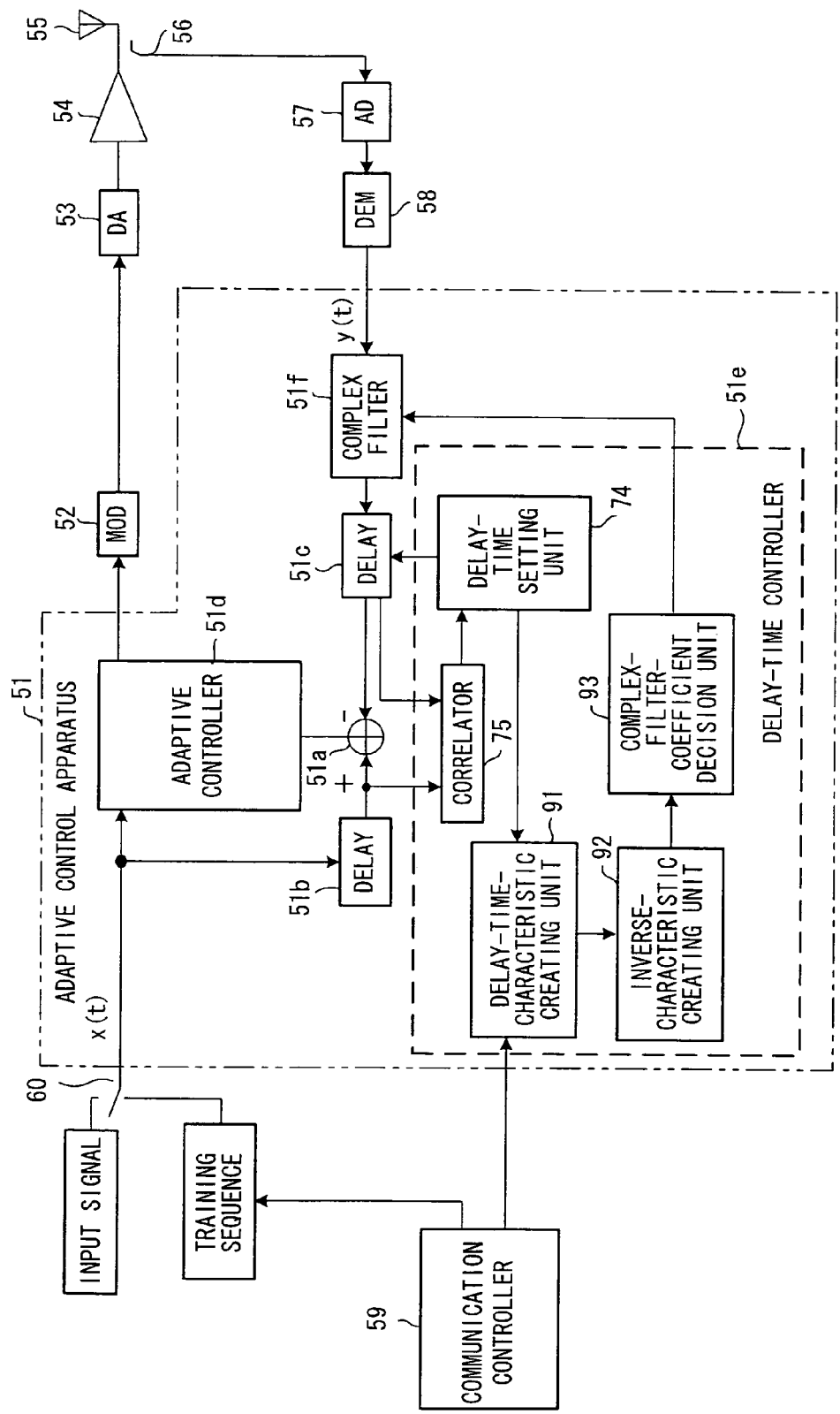
FIG. 16 is a block diagram of an adaptive control apparatus according to an eighth embodiment.

FIG. 16 is a block diagram of an eighth embodiment, in which components identical with those of the first embodiment in FIG. 1 are designated by like reference characters. This embodiment differs from the first embodiment in the following points:

① a complex filter 51f is provided for subjecting the feedback signal y(t) to processing that cancels the delay-time characteristic and inputting the resultant signal to the error calculation unit 51a;

② components for creating a delay-time characteristic, such as the communication controller 59, switch 60 and a delay-time-characteristic creating unit 91, are additionally provided;

③ an inverse-characteristic creating unit 92 for creating a characteristic that is the inverse of the delay-time characteristic is provided; and ④ a complex-filter-coefficient decision unit 93 is provided for deciding coefficients, which are input to the complex filter 51f, in such a manner that the inverse characteristic will be impressed upon the feedback signal.

The delay unit 51c has a structure identical with that of the delay unit 51c in FIG. 1.

Figure 17:
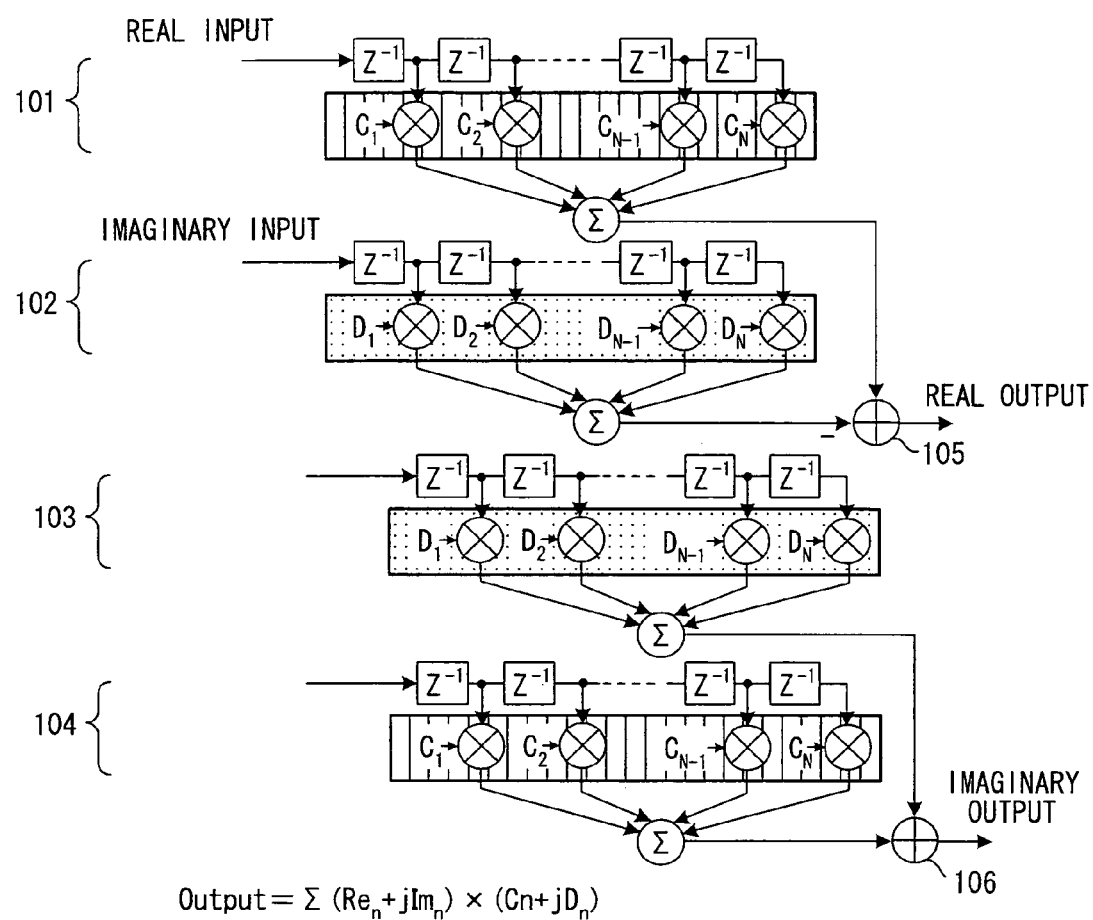
FIG. 17 is a diagram illustrating the structure of a complex filter.
Figure 19:
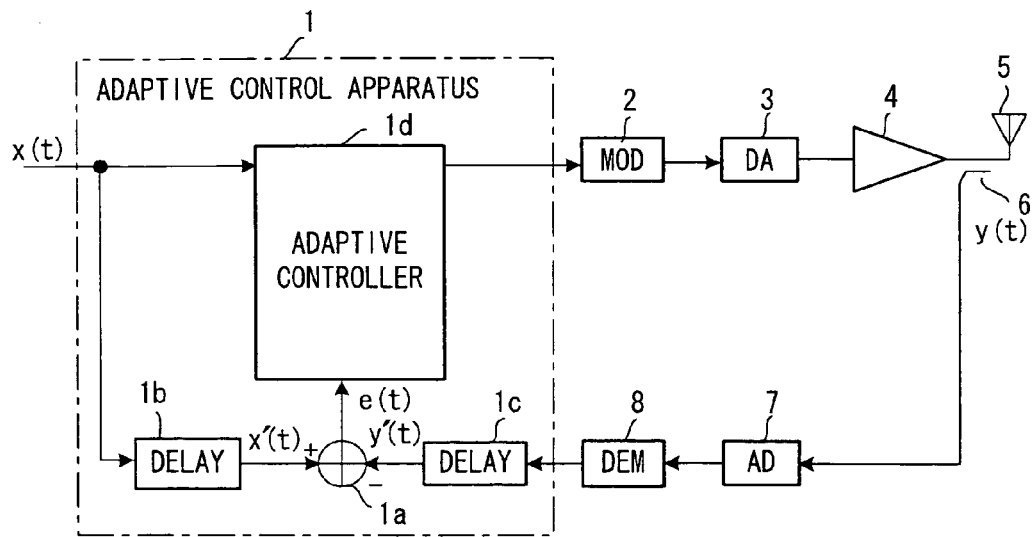
FIG. 19 is a block diagram of an adaptive control apparatus for compensating for distortion that occurs in a power amplifier.
Figure 20:
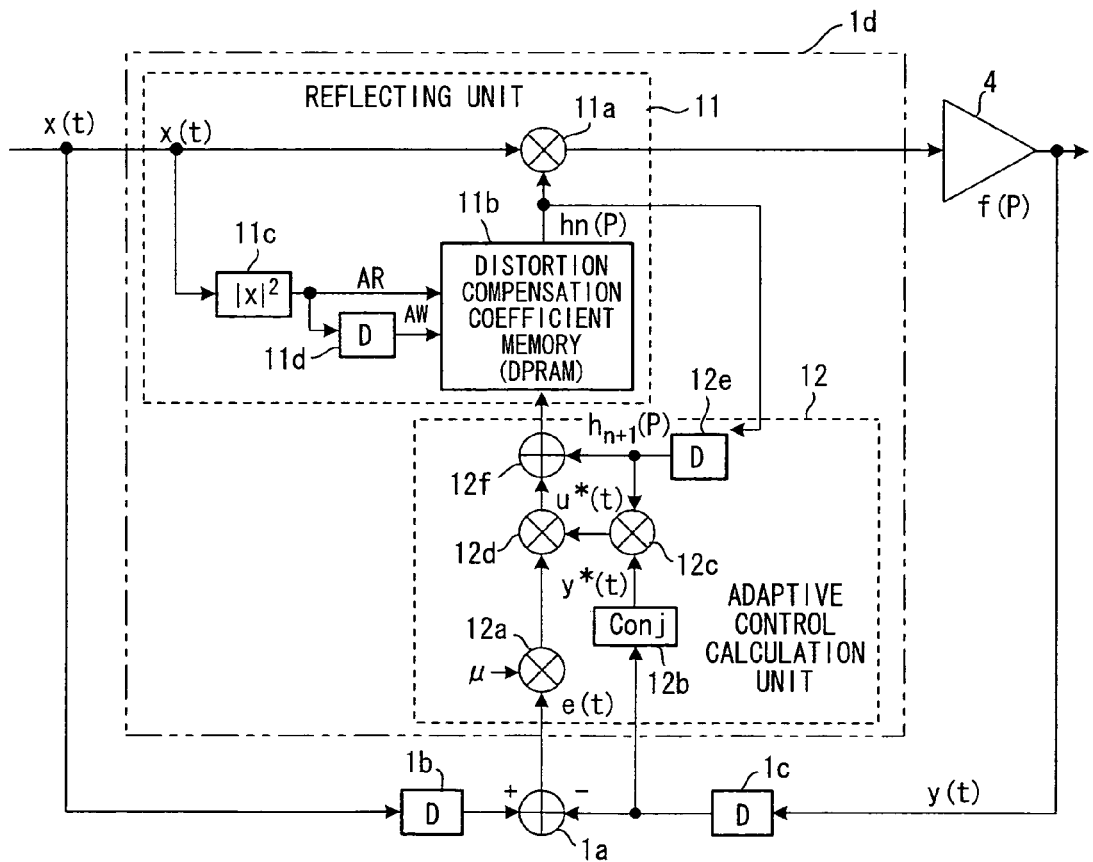
FIG. 20 is a diagram useful in describing operation of an adaptive controller.
Figure 21:
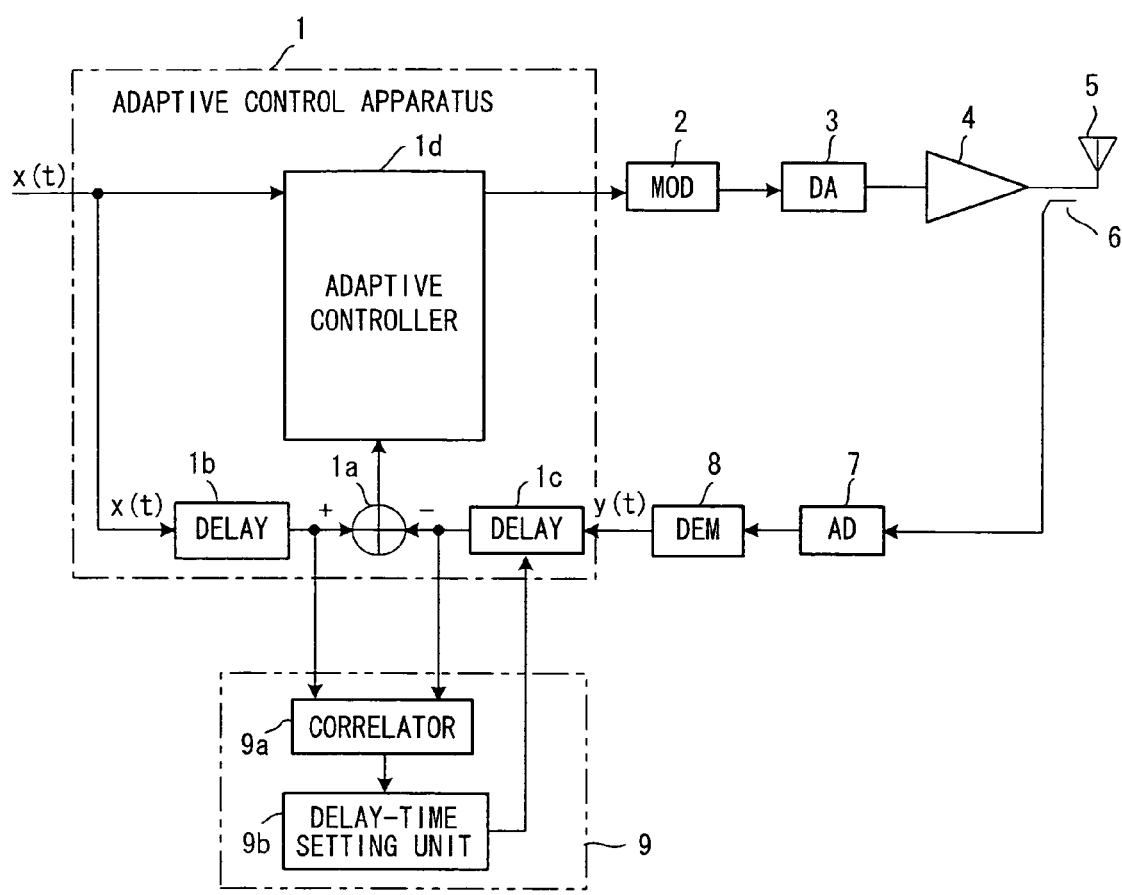
FIG. 21 is a block diagram of delay-time adjustment according to the prior art.

FIG. 17 is a diagram illustrating the structure of the complex filter. The transmit signal and feedback signal are complex signals, though this is not illustrated clearly in FIG. 16. The complex filter 51f comprises four FIR filters 101 to 104 and adders 105, 106. The real part of the feedback signal is input to the FIR filters 101, 103, and the imaginary part of the feedback signal is input to the FIR filters 102, 104. The adder 105 combines the outputs of the FIR filters 101, 102 and outputs the real part, and the adder 106 combines the outputs of the FIR filters 103, 104 and outputs the imaginary part. The coefficients of the FIR filters 101, 104 are identical and represented by Cn (n=1 to N), and the coefficients of the FIR filters 102, 103 are identical and represented by Dn (n=1 to N). The adders 105, 106 output the following:

$$\Sigma(Ren+jIMn)\times(Cn+jDn)$$

A prescribed delay characteristic can be impressed upon the input signal by the coefficients of the complex filter 51f.

The coefficients of the complex filter are decided and input to the complex filter 51f before the transmit signal is transmitted. That is, in a manner similar to that of the second embodiment, the communication controller 59 exercises control in such a manner that the training signal is selected by the switch 60 and instructs the delay-time controller 51e to create the delay-time table. The communication controller 59 then generates a first training signal (see FIG. 2) having a center frequency $f_0$ and inputs the center frequency $f_0$ to the delay-time-characteristic creating unit 91. It should be noted that the complex filter 51f is set in such a manner that it will be a filter whose delay characteristic is flat and for which the coefficient of the imaginary part is zero when the delay characteristic is acquired.

In order to obtain the maximum correlation, the delay-time setting unit 74 controls the second selector 63 (see FIG. 1) of the delay unit 51c and changes over the shift position of the shift register 61 that extracts the feedback signal y(t), thereby changing the delay time of the feedback signal. The delay-time setting unit 74 stores the correlation value calculated by the sliding correlator 75 at each delay time, obtains the delay time for which the correlation value is maximized and inputs this delay time to the delay-time-characteristic creating unit 91. The latter stores the entered delay time in association with the center frequency $f_0$.

The communication controller 59 thenceforth generates the narrow-band training signals in such a manner that frequency increases successively from $f_0$ to $f_3$ in the amount of the signal bandwidth shown at (A) in FIG. 18, and the delay-time-characteristic creating unit 91 stores the delay times in association with the frequencies and creates the delay-time characteristic in the manner described above. As a result, a delay-time characteristic of the kind shown at (B) in FIG. 18 is obtained. Next, the inverse-characteristic creating unit 92 creates a characteristic that is the inverse of the delay-time characteristic, as shown at (C) in FIG. 18, and the complex-filter-coefficient decision unit 93 decides the filter coefficients of the complex filter 51f so as to indicate the inverse characteristic and sets them in the complex filter 51f.

When the setting of the complex filter is complete, the communication controller 59 causes the input signal to be applied to the adaptive control apparatus by the switch 60.

When the transmit signal is input, the adaptive controller 51d reflects the result of adaptive control in the transmit signal x(t), the modulator 52 applies modulation processing to the signal in which adaptive control has been reflected, the DA converter 53 converts the modulated signal to an analog signal and inputs the analog signal to the power amplifier 54, and the power amplifier 54 amplifies the input signal and then releases it into space from the antenna 55.

The directional coupler 56 detects part of the output of the power amplifier, the AD converter 57 converts the detected signal to a digital signal and inputs the digital signal to the demodulator 58, and the latter applies demodulation processing to the input signal and inputs the demodulated signal to the adaptive control apparatus 51.

The complex filter 51f of the adaptive control apparatus applies filtering processing to the feedback signal so as to null the delay-time difference. The error calculation unit 51a calculates the difference e(t) between the reference signal x'(t) and the feedback signal y'(t) that enter via the delay unit 51*b* and complex filter 51*f*, and the adaptive controller 51*d* performs adaptive control so as to diminish the difference e(t) and causes the result of adaptive control to be reflected in the next reference signal. This operation is thenceforth repeated. By virtue of the control above, excellent adaptive control becomes possible.

The foregoing illustrates an example in which the invention is applied to a case where compensation is made for distortion produced by a power amplifier. However, the invention is not limited to such a case and can be applied to a case where noise is reduced by adaptive control.

Further, an example using a sliding correlator as the correlator is illustrated above. However, the correlator can be constructed using a matched filter.

What is claimed is:

1. An adaptive control apparatus having an arithmetic unit for calculating the difference between a reference signal and a feedback signal, and an adaptive controller for applying adaptive control so as to diminish the difference and causing the result of adaptive control to be reflected in the reference signal, comprising:
   a delay unit for delaying at least one of the reference signal and feedback signal by a set delay time in such a manner that the reference signal and feedback signal will be input simultaneously to said arithmetic unit;
   a frequency-component detecting unit for detecting a frequency component of said reference signal;
   a delay-time acquisition unit for acquiring said delay time corresponding to said frequency component;
   a delay-time setting unit for setting said acquired delay time in said delay unit;
   a training signal generator for outputting a plurality of training signals of different frequencies as the reference signal;
   a delay-time-difference detecting unit for measuring the difference between delay times it takes for the reference signal, which is a training signal, and the feedback signal to enter said arithmetic unit; and
   a storage unit for storing a correspondence table indicating correspondence between a center frequency of the training signal and said measured delay-time difference, wherein
   said delay-time acquisition unit acquires a delay-time difference that conforms to said detected frequency component from said correspondence table and said delay-time setting unit sets this delay-time difference in said delay unit as said delay time.

2. An adaptive control apparatus according to claim 1, wherein the delay-time difference detecting unit measures the delay-time difference after said delay time is set in said delay unit, and
   said delay-time setting unit sets said delay-time difference in said delay unit as said delay time.

3. An adaptive control apparatus having an arithmetic unit for calculating the difference between a reference signal and a feedback signal, and an adaptive controller for applying adaptive control so as to diminish the difference and causing the result of adaptive control to be reflected in the reference signal, comprising:
   a delay unit for delaying at least one of the reference signal and feedback signal by a set delay time in such a manner that the reference signal and feedback signal will be input simultaneously to said arithmetic unit;
   a frequency-component detecting unit for detecting a frequency component of said reference signal;
   a delay-time calculation unit for calculating said delay time corresponding to said frequency component;
   a training signal generator for outputting a plurality of training signals of different frequencies as the reference signal; and
   a delay-time-difference detecting unit for measuring the difference between delay times it takes for the reference signal, which is a training signal, and the feedback signal to enter said arithmetic unit, wherein
   said delay-time calculation unit creates a calculation formula that calculates the delay time from the frequency of the reference signal, based upon correspondence between a frequency of the training signal and said measured delay time difference, and
   said delay-time calculation unit calculates a delay time that conforms to said detected frequency using said calculation formula.

4. An adaptive control apparatus having an arithmetic unit for calculating the difference between a reference signal and a feedback signal, and an adaptive controller for applying adaptive control so as to diminish the difference and causing the result of adaptive control to be reflected in the reference signal, comprising:
   a delay unit for delaying at least one of the reference signal and feedback signal by a set delay time in such a manner that the reference signal and feedback signal will be input simultaneously to said arithmetic unit;
   a delay-time acquisition unit for acquiring said delay time based upon a combination of number of carriers and carrier placement or based upon a center frequency specified by number of carriers and carrier placement if said reference signal is a multicarrier signal;
   a delay-time setting unit for setting said acquired delay time in said delay unit; and
   a storage unit for storing a correspondence table indicating correspondence between the combination of number of carriers and carrier placement and delay-time difference, or a correspondence table indicating correspondence between center frequency, which is specified by number of carriers and carrier placement and delay-time difference, wherein
   said delay-time acquisition unit acquires a delay-time difference, which conforms to a combination of actual number of carriers and carrier placement or to said center frequency, from said correspondence table and said delay-time setting unit sets this delay-time difference in said delay unit as the delay time.

5. An adaptive control apparatus according to claim 4, further comprising:
   a delay-time-difference detecting unit for measuring the difference between delay times it takes for the reference signal and feedback signal to enter said arithmetic unit after said delay time is set in said delay unit, wherein
   said delay-time setting unit sets said delay-time difference in said delay unit as said delay time.

6. An adaptive control apparatus according to claim 4, said delay-time acquisition unit acquires said delay time using a calculation formula for calculating the delay time from the number of carriers and carrier placement.

7. An adaptive control apparatus according to claim 4, further comprising:
   a power measurement unit for measuring power of the reference signal, wherein
   said delay-time acquisition unit compensates said delay time based upon a power of the reference signal.

8. An adaptive control apparatus according to claim 4, further comprising:

a temperature measurement unit for measuring temperature inside the apparatus, wherein said delay-time acquisition unit compensates said delay time based upon a temperature inside the apparatus.

9. An adaptive control apparatus having an arithmetic unit for calculating the difference between a reference signal and a feedback signal, and an adaptive controller far applying adaptive control so as to diminish the difference and causing the result of adaptive control to be reflected in the reference signal, comprising:

a storage unit for storing a correspondence table indicating correspondence between carrier frequency and delay time;

a delay unit for delaying at least one of the reference signal and feedback signal by a set delay time in such a manner that the reference signal and feedback signal will be input simultaneously to said arithmetic unit;

a delay-time acquisition unit for acquiring said delay time from the correspondence table based upon a prescribed carrier frequency if the reference signal, in which the result of said adaptive control has been reflected, is carried by a carrier of the prescribed frequency; and a delay-time setting unit for setting said acquired delay time in said delay unit.

10. An adaptive control apparatus according to claim 9, further comprising:

a delay-time-difference detecting unit for measuring the difference between delay times it takes for the reference signal and feedback signal to enter said arithmetic unit after said delay time is set in said delay unit, wherein said delay-time setting unit sets said delay-time difference in said delay unit as said delay time.

11. An adaptive control apparatus having an arithmetic unit for calculating the difference between a reference signal and a feedback signal, and an adaptive controller for applying adaptive control so as to diminish the difference and causing the result of adaptive control to be reflected in the reference signal, comprising:

a delay-time-difference detecting unit for measuring the difference between delay times it takes for said reference signal and feedback signal to enter said arithmetic unit, measurement being performed while changing the frequency of said reference signal;

a delay-time-difference characteristic creating unit for creating a reference-signal frequency vs. delay-time-difference characteristic;

a complex filter, to which said feedback signal is input, for applying an output signal to said arithmetic unit; and a coefficient decision unit for deciding complex filter coefficients so as obtain a characteristic that is the inverse of said delay-time-difference characteristic and setting these coefficients in said complex filter.

* * * * *